(12) United States Patent
Watanabe et al.

(10) Patent No.: US 9,831,848 B2
(45) Date of Patent: *Nov. 28, 2017

(54) ELASTIC WAVE DEVICE AND METHOD FOR MANUFACTURING THE SAME

(71) Applicant: Murata Manufacturing Co., Ltd., Nagaokakyo-shi, Kyoto-fu (JP)

(72) Inventors: Munehisa Watanabe, Nagaokakyo (JP); Hideki Iwamoto, Nagaokakyo (JP); Hajime Kando, Nagaokakyo (JP); Syunsuke Kido, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/212,489

(22) Filed: Jul. 18, 2016

(65) Prior Publication Data
US 2016/0329876 A1  Nov. 10, 2016

Related U.S. Application Data

(63) Continuation of application No. 13/920,492, filed on Jun. 18, 2013, now Pat. No. 9,431,996, which is a (Continued)

(30) Foreign Application Priority Data

Dec. 24, 2010 (JP) .................... 2010-288453

(51) Int. Cl.
*H01L 41/047* (2006.01)
*H03H 9/02* (2006.01)
(Continued)

(52) U.S. Cl.
CPC ........... *H03H 9/0222* (2013.01); *H01L 41/04* (2013.01); *H01L 41/047* (2013.01);
(Continued)

(58) Field of Classification Search
CPC ............................... H03H 9/059; H03H 93/08
(Continued)

(56) References Cited

U.S. PATENT DOCUMENTS 7,105,980 B2 * 9/2006 Abbott ............... H03H 3/08
310/313 A
7,474,033 B2 * 1/2009 Oshio ............... H03H 3/10
310/313 A
(Continued)

OTHER PUBLICATIONS

Watanabe et al., "Elastic Wave Device and Method for Manufacturing the Same", U.S. Appl. No. 13/920,492, filed Jun. 18, 2013.

*Primary Examiner* — Bryan Gordon
(74) *Attorney, Agent, or Firm* — Keating & Bennett, LLP

(57) ABSTRACT

An elastic wave device includes a supporting substrate, a high-acoustic-velocity film stacked on the supporting substrate and in which an acoustic velocity of a bulk wave propagating therein is higher than an acoustic velocity of an elastic wave propagating in a piezoelectric film, a low-acoustic-velocity film stacked on the high-acoustic-velocity film and in which an acoustic velocity of a bulk wave propagating therein is lower than an acoustic velocity of a bulk wave propagating in the piezoelectric film, the piezoelectric film is stacked on the low-acoustic-velocity film, and an IDT electrode stacked on a surface of the piezoelectric film.

23 Claims, 19 Drawing Sheets

Related U.S. Application Data continuation of application No. PCT/JP2011/079496, filed on Dec. 20, 2011.

(51) Int. Cl.

| | | |
|---|---|---|
| *H03H 3/02* | (2006.01) | |
| *H03H 3/04* | (2006.01) | |
| *H03H 3/08* | (2006.01) | |
| *H01L 41/04* | (2006.01) | |
| *H03H 9/54* | (2006.01) | |
| *H03H 3/10* | (2006.01) | |
| *H01L 41/18* | (2006.01) | |
| *H01L 41/22* | (2013.01) | |

(52) U.S. Cl.
CPC .......... *H01L 41/0477* (2013.01); *H01L 41/18* (2013.01); *H01L 41/22* (2013.01); *H03H 3/02* (2013.01); *H03H 3/04* (2013.01); *H03H 3/08* (2013.01); *H03H 3/10* (2013.01); *H03H 9/02574* (2013.01); *H03H 9/02834* (2013.01); *H03H 9/54* (2013.01); *H03H 2003/023* (2013.01); *H03H 2003/027* (2013.01); *Y10T 29/42* (2015.01); *Y10T 29/49005* (2015.01); *Y10T 29/49155* (2015.01)

(58) Field of Classification Search
USPC ...... 310/313 A, 313 B, 313 C, 313 D, 313 R
See application file for complete search history.

(56) References Cited

U.S. PATENT DOCUMENTS

| | | | | |
|---|---|---|---|---|
| 2007/0285191 | A1* | 12/2007 | Jacobsen | H03H 3/04 333/187 |
| 2008/0157629 | A1* | 7/2008 | Noguchi | B41J 2/161 310/313 R |
| 2009/0085429 | A1* | 4/2009 | Nishiyama | H03H 9/02559 310/313 A |
| 2009/0102318 | A1* | 4/2009 | Kando | H03H 3/08 310/313 R |

* cited by examiner

ELASTIC WAVE DEVICE AND METHOD FOR MANUFACTURING THE SAME

BACKGROUND OF THE INVENTION

1. Field of the Invention

The present invention relates to an elastic wave device preferably for use in a resonator, a bandpass filter, or the like and a method for manufacturing the same. More particularly, the present invention relates to an elastic wave device having a structure including a supporting substrate, a piezoelectric layer, and a layer of another material disposed therebetween, and a method for manufacturing the same.

2. Description of the Related Art

Elastic wave devices have been widely used as resonators and bandpass filters, and in recent years, there has been a need for increasing the frequency thereof. Japanese Unexamined Patent Application Publication No. 2004-282232 described below discloses a surface acoustic wave device in which a hard dielectric layer, a piezoelectric film, and an IDT electrode are stacked in that order on a dielectric substrate. In such a surface acoustic wave device, by disposing the hard dielectric layer between the dielectric substrate and the piezoelectric film, an increase in the acoustic velocity of surface acoustic waves is achieved. It is described that thereby, the frequency of the surface acoustic wave device can be increased.

Japanese Unexamined Patent Application Publication No. 2004-282232 also discloses a structure in which a potential equalizing layer is provided between the hard dielectric layer and the piezoelectric film. The potential equalizing layer is composed of a metal or semiconductor. The potential equalizing layer is provided in order to equalize the potential at the interface between the piezoelectric film and the hard dielectric layer.

In the surface acoustic wave device described in Japanese Unexamined Patent Application Publication No. 2004-282232, an increase in acoustic velocity is achieved by forming the hard dielectric layer. However, there is considerable propagation loss, and surface acoustic waves cannot be effectively confined within the piezoelectric thin film. Consequently, the energy of the surface acoustic wave device leaks into the dielectric substrate, and therefore, it is not possible to enhance the Q factor, which is a problem.

SUMMARY OF THE INVENTION

Preferred embodiments of the present invention provide an elastic wave device having a high Q factor and a method for manufacturing the same.

An elastic wave device including a piezoelectric film according to a preferred embodiment of the present invention includes a high-acoustic-velocity supporting substrate in which the acoustic velocity of a bulk wave propagating therein is higher than the acoustic velocity of an elastic wave propagating in the piezoelectric film; a low-acoustic-velocity film stacked on the high-acoustic-velocity supporting substrate, in which the acoustic velocity of a bulk wave propagating therein is lower than the acoustic velocity of a bulk wave propagating in the piezoelectric film; the piezoelectric film stacked on the low-acoustic-velocity film; and an IDT electrode disposed on a surface of the piezoelectric film.

The elastic wave device including a piezoelectric film according to a preferred embodiment of the present invention is structured such that some portion of energy of an elastic wave propagating in the piezoelectric film is distributed into the low-acoustic-velocity film and the high-acoustic-velocity supporting substrate.

An elastic wave device including a piezoelectric film according to a preferred embodiment of the present invention includes a supporting substrate; a high-acoustic-velocity film disposed on the supporting substrate, in which the acoustic velocity of a bulk wave propagating therein is higher than the acoustic velocity of an elastic wave propagating in the piezoelectric film; a low-acoustic-velocity film stacked on the high-acoustic-velocity film, in which the acoustic velocity of a bulk wave propagating therein is lower than the acoustic velocity of a bulk wave propagating in the piezoelectric film; the piezoelectric film stacked on the low-acoustic-velocity film; and an IDT electrode disposed on a surface of the piezoelectric film.

The elastic wave device including a piezoelectric film according to a preferred embodiment of the present invention is structured such that some portion of energy of an elastic wave propagating in the piezoelectric film is distributed into the low-acoustic-velocity film and the high-acoustic-velocity film.

In a specific aspect of the elastic wave device according to a preferred embodiment of the present invention, the low-acoustic-velocity film is preferably made of silicon oxide or a film containing as a major component silicon oxide. In such a case, the absolute value of the temperature coefficient of frequency TCF can be decreased. Furthermore, the electromechanical coupling coefficient can be increased, and the band width ratio can be enhanced. That is, an improvement in temperature characteristics and an enhancement in the band width ratio can be simultaneously achieved.

In another specific aspect of the elastic wave device according to a preferred embodiment of the present invention, the thickness of the piezoelectric film preferably is about 1.5λ or less, for example, where λ is the wavelength of an elastic wave determined by the electrode period of the IDT electrode. In such a case, by selecting the thickness of the piezoelectric film in a range of about 1.5λ or less, for example, the electromechanical coupling coefficient can be easily adjusted.

In another specific aspect of the elastic wave device according to a preferred embodiment of the present invention, by selecting the thickness of the piezoelectric film in a range of about 0.05, to about 0.5λ, where λ is the wavelength of an elastic wave determined by the electrode period of the IDT electrode, the electromechanical coupling coefficient can be easily adjusted over a wide range.

In another specific aspect of the elastic wave device according to a preferred embodiment of the present invention, the thickness of the low-acoustic-velocity film preferably is a preferred embodiment of 2λ or less, for example, where λ is the wavelength of an elastic wave determined by the electrode period of the IDT electrode. In such a case, by selecting the thickness of the low-acoustic-velocity film in a range of about 2λ or less, for example, the electromechanical coupling coefficient can be easily adjusted. Furthermore, the warpage of the elastic wave device due to the film stress of the low-acoustic-velocity film can be reduced. Consequently, freedom of design can be increased, and it is possible to provide a high-quality elastic wave device which is easy to handle.

In another specific aspect of the elastic wave device according to a preferred embodiment of the present invention, the piezoelectric film is preferably made of single-crystal lithium tantalate with Euler angles (0±5°, θ, ψ), and the Euler angles (0±5°, θ, ψ) are located in any one of a plurality of regions R1 shown in FIG. 17. In such a case, the electromechanical coupling coefficient of the SH component of the elastic wave can be set at about 2% or more, for example. Consequently, the electromechanical coupling coefficient can be sufficiently increased.

In another specific aspect of the elastic wave device according to a preferred embodiment of the present invention, the piezoelectric film is preferably made of single-crystal lithium tantalate with Euler angles (0±5°, θ, ψ), and the Euler angles (0±5°, θ, ψ) are located in any one of a plurality of regions R2 shown in FIG. 18. In such a case, the electromechanical coupling coefficient of the SH component used can be increased, and the SV wave, which is spurious, can be effectively suppressed.

In another specific aspect of the elastic wave device according to a preferred embodiment of the present invention, the coefficient of linear expansion of the supporting substrate is lower than that of the piezoelectric film. In such a case, the temperature characteristics can be further improved.

In another specific aspect of the elastic wave device according to a preferred embodiment of the present invention, the specific acoustic impedance of the low-acoustic-velocity film is lower than that of the piezoelectric film. In such a case, the band width ratio can be further enhanced.

In another specific aspect of the elastic wave device according to a preferred embodiment of the present invention, a dielectric film is disposed on the piezoelectric film and the IDT electrode, and a surface acoustic wave propagates in the piezoelectric film.

In another specific aspect of the elastic wave device according to a preferred embodiment of the present invention, a dielectric film is disposed on the piezoelectric film and the IDT electrode, and a boundary acoustic wave propagates along a boundary between the piezoelectric film and the dielectric film.

In another specific aspect of the elastic wave device according to a preferred embodiment of the present invention, at least one of an adhesion layer, an underlying film, a low-acoustic-velocity layer, and a high-acoustic-velocity layer is disposed in at least one of boundaries between the piezoelectric film, the low-acoustic-velocity film, the high-acoustic-velocity film, and the supporting substrate.

A method for manufacturing an elastic wave device according to yet another preferred embodiment of the present invention includes a step of preparing a supporting substrate; a step of forming a high-acoustic-velocity film, in which the acoustic velocity of a bulk wave propagating therein is higher than the acoustic velocity of an elastic wave propagating in a piezoelectric, on the supporting substrate; a step of forming a low-acoustic-velocity film, in which the acoustic velocity of a bulk wave propagating therein is lower than the acoustic velocity of a bulk wave propagating in a piezoelectric, on the high-acoustic-velocity film; a step of forming a piezoelectric layer on the low-acoustic-velocity film; and a step of forming an IDT electrode on a surface of the piezoelectric layer.

In a specific aspect of the method for manufacturing an elastic wave device according to a preferred embodiment of the present invention, the steps of forming the high-acoustic-velocity film, the low-acoustic-velocity film, and the piezoelectric layer on the supporting substrate include the following steps (a) to (e).

(a) A step of performing ion implantation from a surface of a piezoelectric substrate having a larger thickness than that of the piezoelectric layer.

(b) A step of forming the low-acoustic-velocity film on the surface of the piezoelectric substrate on which the ion implantation has been performed.

(c) A step of forming the high-acoustic-velocity film on a surface of the low-acoustic-velocity film, opposite to the piezoelectric substrate side of the low-acoustic-velocity film.

(d) A step of bonding the supporting substrate to a surface of the high-acoustic-velocity film, opposite to the surface on which the low-acoustic-velocity film is stacked.

(e) A step of, while heating the piezoelectric substrate, separating a piezoelectric film, at a high concentration ion-implanted region of the piezoelectric substrate in which the implanted ion concentration is highest, from a remaining portion of the piezoelectric substrate such that the piezoelectric film remains on the low-acoustic-velocity film side.

In another specific aspect of the method for manufacturing an elastic wave device according to a preferred embodiment of the present invention, the method further includes a step of, after separating the remaining portion of the piezoelectric substrate, heating the piezoelectric film disposed on the low-acoustic-velocity film to recover piezoelectricity. In such a case, since the piezoelectricity of the piezoelectric film can be recovered by heating, it is possible to provide an elastic wave device having good characteristics.

In another specific aspect of the method for manufacturing an elastic wave device according to a preferred embodiment of the present invention, the method further includes a step of, prior to bonding the supporting substrate, performing mirror finishing on the surface of the high-acoustic-velocity film, opposite to the low-acoustic-velocity film side of the high-acoustic-velocity film. In such a case, it is possible to strengthen bonding between the high-acoustic-velocity film and the supporting substrate.

In the elastic wave device according to various preferred embodiments of the present invention, since the high-acoustic-velocity film and the low-acoustic-velocity film are disposed between the supporting substrate and the piezoelectric film, the Q factor can be enhanced. Consequently, it is possible to provide an elastic wave device having a high Q factor.

Furthermore, in the manufacturing method according to various preferred embodiments of the present invention, it is possible to provide an elastic wave device of the present invention having a high Q factor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by describing specific preferred embodiments of the present invention with reference to the drawings.

Figure 1A:
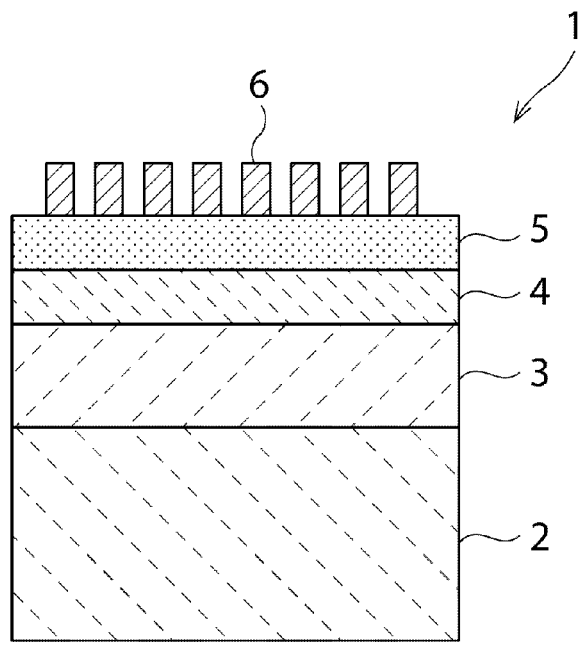
FIG. 1A is a schematic elevational cross-sectional view of a surface acoustic wave device according to a first preferred embodiment of the present invention.

FIG. 1A is a schematic elevational cross-sectional view of a surface acoustic wave device according to a first preferred embodiment of the present invention.

A surface acoustic wave device 1 includes a supporting substrate 2. A high-acoustic-velocity film 3 having a relatively high acoustic velocity is stacked on the supporting substrate 2. A low-acoustic-velocity film 4 having a relatively low acoustic velocity is stacked on the high-acoustic-velocity film 3. A piezoelectric film 5 is stacked on the low-acoustic-velocity film 4. An IDT electrode 6 is stacked on the upper surface of the piezoelectric film 5. Note that the IDT electrode 6 may be disposed on the lower surface of the piezoelectric film 5.

The supporting substrate 2 may be composed of an appropriate material as long as it can support the laminated structure including the high-acoustic-velocity film 3, the low-acoustic-velocity film 4, the piezoelectric film 5, and the IDT electrode 6. Examples of such a material that can be used include piezoelectrics, such as sapphire, lithium tantalate, lithium niobate, and quartz; various ceramics, such as alumina, magnesia, silicon nitride, aluminum nitride, silicon carbide, zirconia, cordierite, mullite, steatite, and forsterite; dielectrics, such as glass; semiconductors, such as silicon and gallium nitride; and resin substrates. In this preferred embodiment, the supporting substrate 2 is preferably composed of glass.

The high-acoustic-velocity film 3 functions in such a manner that a surface acoustic wave is confined to a portion in which the piezoelectric film 5 and the low-acoustic-velocity film 4 are stacked and the surface acoustic wave does not leak into the structure below the high-acoustic-velocity film 3. In this preferred embodiment, the high-acoustic-velocity film 3 is preferably composed of aluminum nitride. As the material for high-acoustic-velocity film 3, as long as it is capable of confining the elastic wave, any of various high-acoustic-velocity materials can be used. Examples thereof include aluminum nitride, aluminum oxide, silicon carbide, silicon nitride, silicon oxynitride, a DLC film or diamond, media mainly composed of these materials, and media mainly composed of mixtures of these materials. In order to confine the surface acoustic wave to the portion in which the piezoelectric film 5 and the low-acoustic-velocity film 4 are stacked, it is preferable that the thickness of the high-acoustic-velocity film 3 be as large as possible. The thickness of the high-acoustic-velocity film 3 is preferably about 0.5 times or more, more preferably about 1.5 times or more, than the wavelength λ of the surface acoustic wave.

In this description, the "high-acoustic-velocity film" is defined as a film in which the acoustic velocity of a bulk wave propagating therein is higher than the acoustic velocity of an elastic wave, such as a surface acoustic wave or a boundary acoustic wave, propagating in or along the piezoelectric film 5. Furthermore, the "low-acoustic-velocity film" is defined as a film in which the acoustic velocity of a bulk wave propagating therein is lower than the acoustic velocity of a bulk wave propagating in the piezoelectric film 5. Furthermore, elastic waves with various modes having different acoustic velocities are excited by an IDT electrode having a certain structure. The "elastic wave propagating in the piezoelectric film 5" represents an elastic wave with a specific mode used for obtaining filter or resonator characteristics. The bulk wave mode that determines the acoustic velocity of the bulk wave is defined in accordance with the usage mode of the elastic wave propagating in the piezoelectric film 5. In the case where the high-acoustic-velocity film 3 and the low-acoustic-velocity film 4 are isotropic with respect to the propagation direction of the bulk wave, correspondences are as shown in Table 1 below. That is, for the dominant mode of the elastic wave shown in the left column of Table 1, the high acoustic velocity and the low acoustic velocity are determined according to the mode of the bulk wave shown in the right column of Table 1. The P wave is a longitudinal wave, and the S wave is a transversal wave.

In Table 1, U1 represents an elastic wave containing as a major component a P wave, U2 represents an elastic wave containing as a major component an SH wave, and U3 represents an elastic wave containing as a major component an SV wave.

TABLE 1

Correspondence of the elastic wave mode of the piezoelectric film to the bulk wave mode of the dielectric film (in the case where the dielectric film is composed of an isotropic material)

| Dominant mode of the elastic wave propagating in the piezoelectric film | Mode of the bulk wave propagating in the dielectric film |
| --- | --- |
| U1 | P wave |
| U2 | S wave |
| U3 + U1 | S wave |

In the case where the low-acoustic-velocity film 4 and the high-acoustic-velocity film 3 are anisotropic with respect to the propagation of the bulk wave, bulk wave modes that determine the high acoustic velocity and the low acoustic velocity are shown in Table 2 below. In addition, in the bulk wave modes, the slower of the SH wave and the SV wave is referred to as a slow transversal wave, and the faster of the two is referred to as a fast transversal wave. Which of the two is the slow transversal wave depends on the anisotropy of the material. In LiTaO₃ or LiNbO₃ cut in the vicinity of rotated Y cut, in the bulk wave modes, the SV wave is the slow transversal wave, and the SH wave is the fast transversal wave.

TABLE 2

Correspondence of the elastic wave mode of the piezoelectric film to the bulk wave mode of the dielectric film (in the case where the dielectric film is composed of an anisotropic material)

| Dominant mode of the elastic wave propagating in the piezoelectric film | Mode of the bulk wave propagating in the dielectric film |
| --- | --- |
| U1 | P wave |
| U2 | SH wave |
| U3 + U1 | SV wave |

In this preferred embodiment, the low-acoustic-velocity film 4 is preferably composed of silicon oxide, and the thickness thereof preferably is about 0.35λ, where λ is the wavelength of an elastic wave determined by the electrode period of the IDT electrode.

As the material constituting the low-acoustic-velocity film 4, it is possible to use any appropriate material having a bulk wave acoustic velocity that is slower than the acoustic velocity of the bulk wave propagating in the piezoelectric film 5. Examples of such a material that can be used include silicon oxide, glass, silicon oxynitride, tantalum oxide, and media mainly composed of these materials, such as compounds obtained by adding fluorine, carbon, or boron to silicon oxide.

The low-acoustic-velocity film and the high-acoustic-velocity film are each composed of an appropriate dielectric material capable of achieving a high acoustic velocity or a low acoustic velocity that is determined as described above.

In this preferred embodiment, the piezoelectric film 5 is preferably composed of 38.5° Y cut $LiTaO_3$, i.e., $LiTaO_3$ with Euler angles of (0°, 128.5°, 0°), and the thickness thereof preferably is about 0.25λ, where λ is the wavelength of a surface acoustic wave determined by the electrode period of the IDT electrode 6. However, the piezoelectric film 5 may be composed of $LiTaO_3$ with other cut angles, or a piezoelectric single crystal other than $LiTaO_3$.

In this preferred embodiment, the IDT electrode 6 is preferably composed of Al. However, the IDT electrode 6 may be made of any appropriate metal material, such as Al, Cu, Pt, Au, Ag, Ti, Ni, Cr, Mo, W, or an alloy mainly composed of any one of these metals. Furthermore, the IDT electrode 6 may have a structure in which a plurality of metal films composed of these metals or alloys are stacked.

Figure 1B:
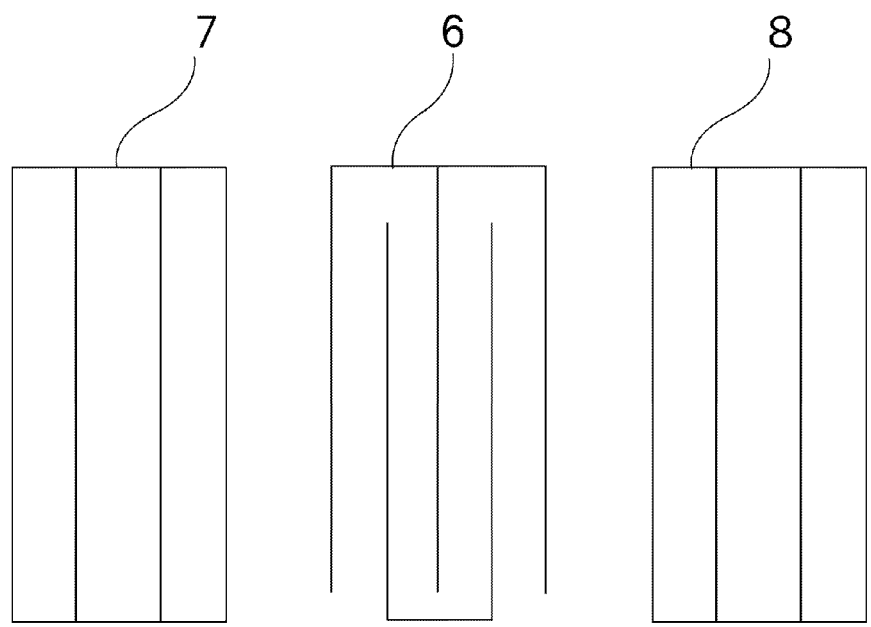
FIG. 1B is a schematic plan view showing an electrode structure of the surface acoustic wave device.

Although schematically shown in FIG. 1A, an electrode structure shown in FIG. 1B is disposed on the piezoelectric film 5. That is, the IDT electrode 6 and reflectors 7 and 8 arranged on both sides in the surface acoustic wave electrode direction of the IDT electrode 6 are disposed. A one-port-type surface acoustic wave resonator is thus constituted. However, the electrode structure including the IDT electrode in the present invention is not particularly limited, and a modification is possible such that an appropriate resonator, a ladder filter in which resonators are combined, a longitudinally coupled filter, a lattice-type filter, or a transversal type filter is provided.

The surface acoustic wave device 1 according to the present preferred embodiment preferably includes the high-acoustic-velocity film 3, the low-acoustic-velocity film 4, and the piezoelectric film 5 stacked on each other. Thereby, the Q factor can be increased. The reason for this is as follows.

In the related art, it is known that, by disposing a high-acoustic-velocity film on the lower surface of a piezoelectric substrate, some portion of a surface acoustic wave propagates while distributing energy into the high-acoustic-velocity film, and therefore, the acoustic velocity of the surface acoustic wave can be increased.

In contrast, in various preferred embodiments of the present invention of the present application, since the low-acoustic-velocity film 4 is disposed between the high-acoustic-velocity film 3 and the piezoelectric film 5, the acoustic velocity of an elastic wave is decreased. Energy of an elastic wave essentially concentrates on a low-acoustic-velocity medium. Consequently, it is possible to enhance an effect of confining elastic wave energy to the piezoelectric film 5 and the IDT in which the elastic wave is excited. Therefore, in accordance with this preferred embodiment, the loss can be reduced and the Q factor can be enhanced compared with the case where the low-acoustic-velocity film 4 is not provided. Furthermore, the high-acoustic-velocity film 3 functions such that an elastic wave is confined to a portion in which the piezoelectric film 5 and the low-acoustic-velocity film 4 are stacked and the elastic wave does not leak into the structure below the high-acoustic-velocity film 3. That is, in the structure of a preferred embodiment of the present invention, energy of an elastic wave of a specific mode used to obtain filter or resonator characteristics is distributed into the entirety of the piezoelectric film 5 and the low-acoustic-velocity film 4 and partially distributed into the low-acoustic-velocity film side of the high-acoustic-velocity film 3, but is not distributed into the supporting substrate 2. The mechanism of confining the elastic wave by the high-acoustic-velocity film is similar to that in the case of a Love wave-type surface acoustic wave, which is a non-leaky SH wave, and for example, is described in Kenya Hashimoto; "Introduction to simulation technologies for surface acoustic wave devices"; Realize; pp. 90-91. The mechanism is different from the confinement mechanism in which a Bragg reflector including an acoustic multilayer film is used.

In addition, in this preferred embodiment, since the low-acoustic-velocity film 4 is preferably composed of silicon oxide, temperature characteristics can be improved. The elastic constant of $LiTaO_3$ has a negative temperature characteristic, and silicon oxide has a positive temperature characteristic. Consequently, in the surface acoustic wave device 1, the absolute value of TCF can be decreased. In addition, the specific acoustic impedance of silicon oxide is lower than that of $LiTaO_3$. Consequently, an increase in the electromechanical coupling coefficient, i.e., an enhancement in the band width ratio and an improvement in frequency temperature characteristics can be simultaneously achieved.

Furthermore, by adjusting the thickness of the piezoelectric film 5 and the thickness of each of the high-acoustic-velocity film 3 and the low-acoustic-velocity film 4, as will be described later, the electromechanical coupling coefficient can be adjusted in a wide range. Consequently, freedom of design can be increased.

Specific experimental examples of the surface acoustic wave device according to the preferred embodiment described above will be described below to demonstrate the operation and advantageous effects of the preferred embodiment.

A surface acoustic wave device 1 according to the first preferred embodiment and surface acoustic wave devices according to first and second comparative examples described below were fabricated.

First Preferred Embodiment

Al electrode (thickness: 0.08λ)/38.5° Y cut $LiTaO_3$ thin film (thickness: 0.25λ)/silicon oxide film (thickness: 0.35λ)/aluminum nitride film (1.5λ)/supporting substrate composed of glass stacked in that order from the top.

First comparative example: electrode composed of Al (thickness: 0.08λ)/38.5° Y cut $LiTaO_3$ substrate stacked in that order from the top. In the first comparative example, the electrode composed of Al was formed on the $LiTaO_3$ substrate with a thickness of 350 μm.

Second Comparative Example

Al electrode (thickness: 0.08λ)/38.5° Y cut $LiTaO_3$ film with a thickness of 0.5λ/aluminum nitride film (thickness: 1.5λ)/supporting substrate composed of glass stacked in that order from the top.

In each of the surface acoustic wave devices of the first preferred embodiment and the first and second comparative examples, the electrode had a one-port-type surface acoustic wave resonator structure shown in FIG. 1B. The wavelength λ determined by the electrode period of the IDT electrode was 2 μm. The dominant mode of the surface acoustic wave propagating in the 38.5° Y cut $LiTaO_3$ is the U2 mode, and its acoustic velocity is about 3,950 m/sec. Furthermore, the acoustic velocity of the bulk wave propagating in a rotated Y cut $LiTaO_3$ is constant regardless of the rotation angle (Y cut). The acoustic velocity of the SV bulk wave (slow transversal wave) is 3,367 m/sec, and the acoustic velocity of the SH bulk wave (fast transversal wave) is 4,212 m/sec.

Furthermore, in each of the first preferred embodiment and the second comparative example, the aluminum nitride film is an isotropic film, and the acoustic velocity of the bulk wave (S wave) in the aluminum nitride film is 6,000 m/sec. Furthermore, the silicon oxide film as the low-acoustic-velocity film 4 formed in the first preferred embodiment is an isotropic film, and the acoustic velocity of the bulk wave (S wave) in silicon oxide is 3,750 m/sec. Accordingly, since the dominant mode of the surface acoustic wave propagating the piezoelectric is the U2 mode, the following conditions are satisfied.

(1) Acoustic velocity of the bulk wave (S wave) in the high-acoustic-velocity film: 6,000 m/sec>Acoustic velocity of the dominant mode (U2) of the surface acoustic wave: 3,950 m/sec.

(2) Acoustic velocity of the bulk wave (S wave) in the low-acoustic-velocity film: 3,750 m/sec<Acoustic velocity of the bulk wave (SH) propagating in the piezoelectric film: 4,212 m/sec.

Figure 2:
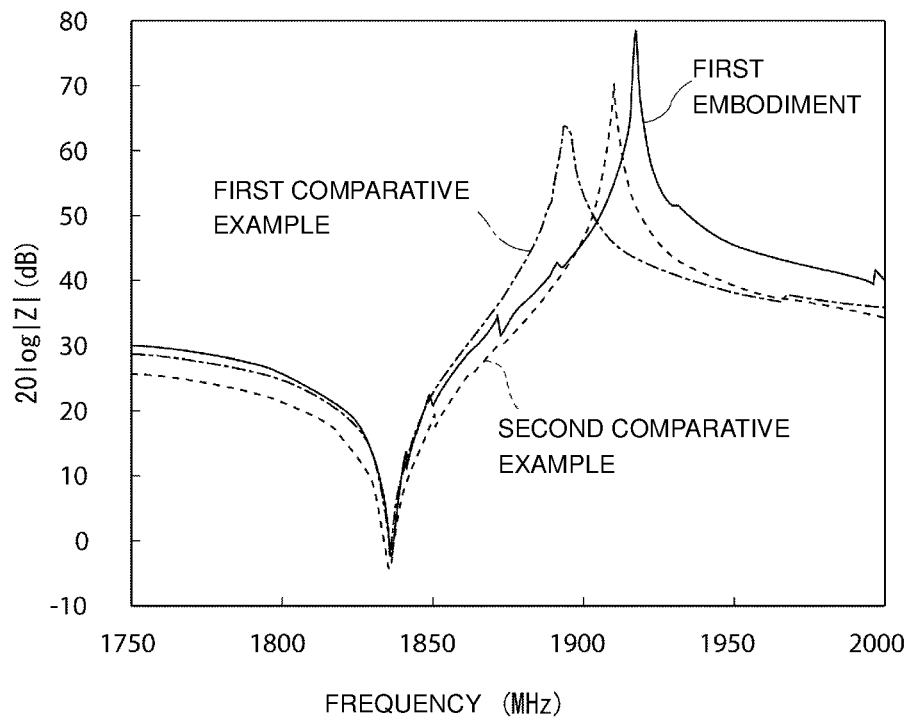
FIG. 2 is a graph showing impedance characteristics of surface acoustic wave devices of the first preferred embodiment, a first comparative example, and a second comparative example.
Figure 3:
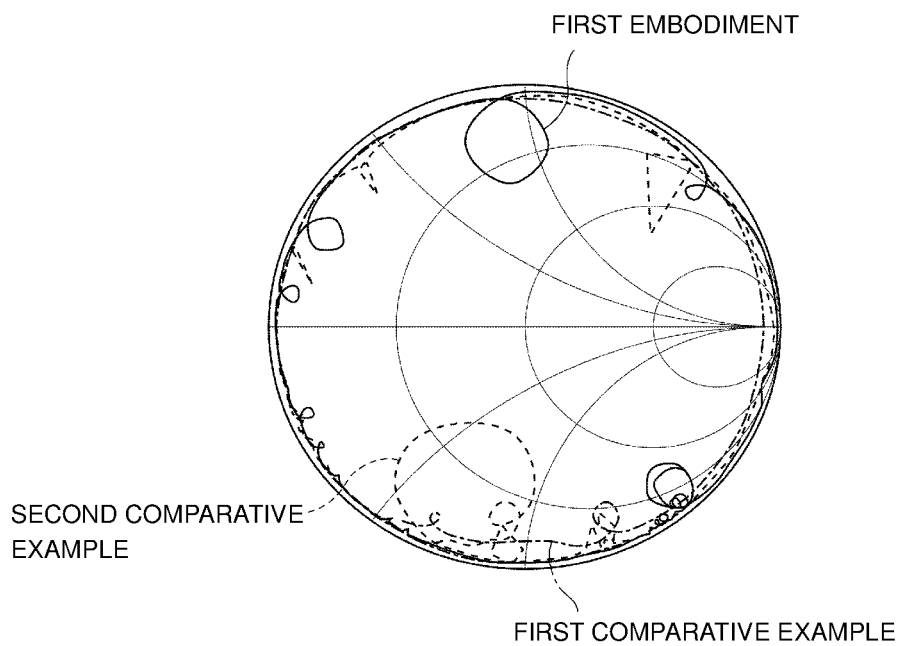
FIG. 3 shows an impedance Smith chart for the surface acoustic wave devices of the first preferred embodiment, the first comparative example, and the second comparative example.
Figure 4A:
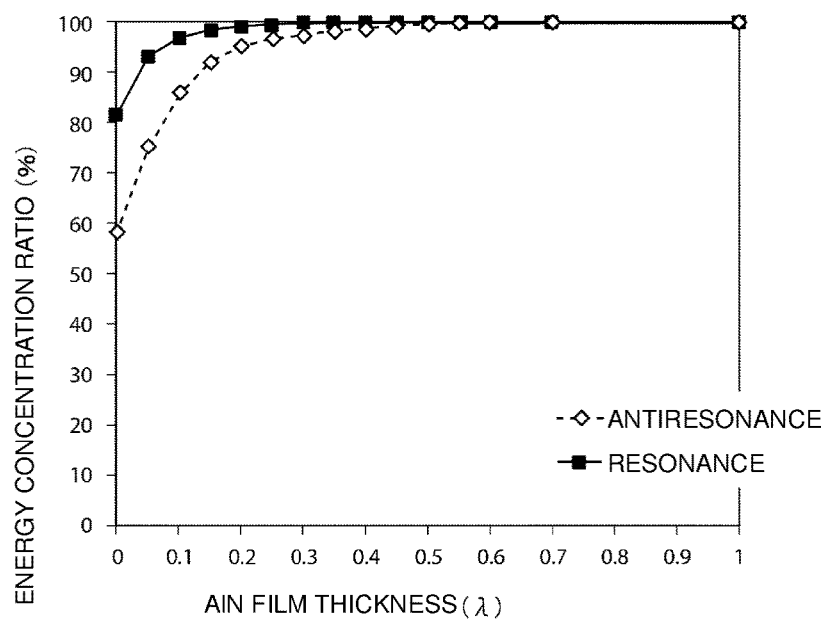
FIGS. 4A and 4B are each a graph showing the results of simulation in the IDT electrode portion of the surface acoustic wave device of the first preferred embodiment of the present invention, regarding the relationship between the AlN film thickness and the percentage of energy concentration.
Figure 4B:
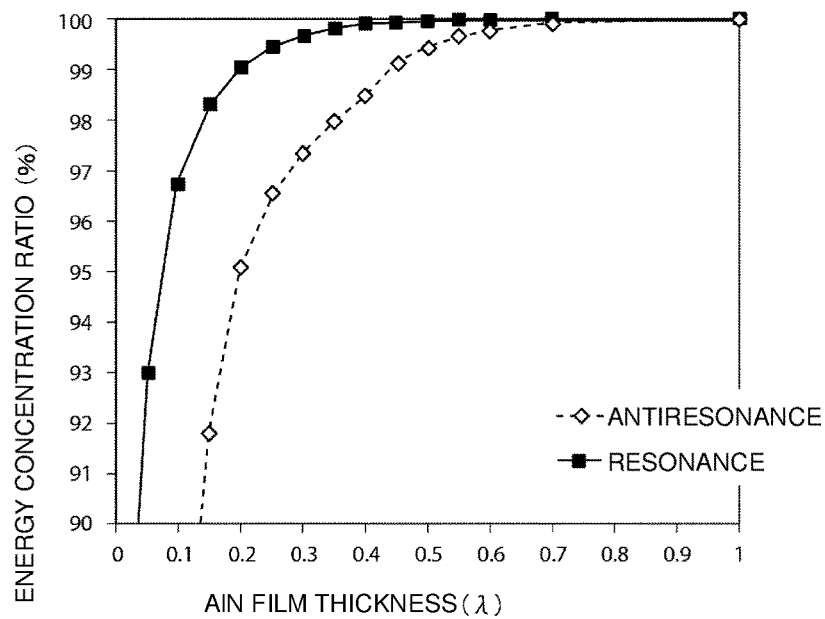

FIG. 2 shows the impedance-frequency characteristics of the surface acoustic wave devices of the first preferred embodiment and the first and second comparative examples, and FIG. 3 shows an impedance Smith chart.

Furthermore, as shown in Table 3 below, in the surface acoustic wave devices of the first preferred embodiment and the first and second comparative examples, the Q factor at the resonant frequency, the Q factor at the antiresonant frequency, the band width ratio, and the TCF at the resonant frequency were obtained by actual measurement.

The results are shown in Table 3 below.

TABLE 3

|  | Q (Resonance) | Q (Anti-resonance) | Band width ratio [%] | TCF [ppm/° C.] (Resonance) |
| --- | --- | --- | --- | --- |
| First comparative example | 818 | 527 | 3.2 | −45 |
| Second comparative example | 777 | 1285 | 4.1 | −45 |
| First embodiment | 1026 | 2080 | 4.4 | −25 |

In FIGS. 2 and 3, the solid line represents the results of the first preferred embodiment, the dashed line represents the results of the second comparative example, and the dotted-chain line represents the results of the first comparative example.

As is clear from FIGS. 2 and 3, in the second comparative example and the first preferred embodiment, the top-to-valley ratio is higher than that in the first comparative example. The top-to-valley ratio is a ratio of the impedance at an antiresonant frequency to the impedance at a resonant frequency. As this value increases, it becomes possible to configure a filter having a higher Q factor and lower insertion loss. It is evident that, in particular, in the first preferred embodiment, the top-to-valley ratio is much higher than that in the second comparative example. Furthermore, it is also evident that according to the first preferred embodiment, the frequency difference between the resonant frequency and the antiresonant frequency, i.e., the band width ratio, can be increased compared with the second comparative example.

Specifically, as is clear from Table 3, according to the first preferred embodiment, the Q factor at the resonant frequency can be increased, and in particular, the Q factor at the antiresonant frequency can be greatly increased compared with the first and second comparative examples. That is, since it is possible to configure a one-port-type surface acoustic wave resonator having a high Q factor, a filter having low insertion loss can be configured using the surface acoustic wave device 1. Furthermore, the band width ratio is 3.2% in the first comparative example and 4.1% in the second comparative example. In contrast, the band width ratio increases to 4.4% in the first preferred embodiment.

In addition, as is clear from Table 3, according to the first preferred embodiment, since the silicon oxide film is disposed, the absolute value of TCF can be greatly decreased compared with the first and second comparative examples.

Figure 5:
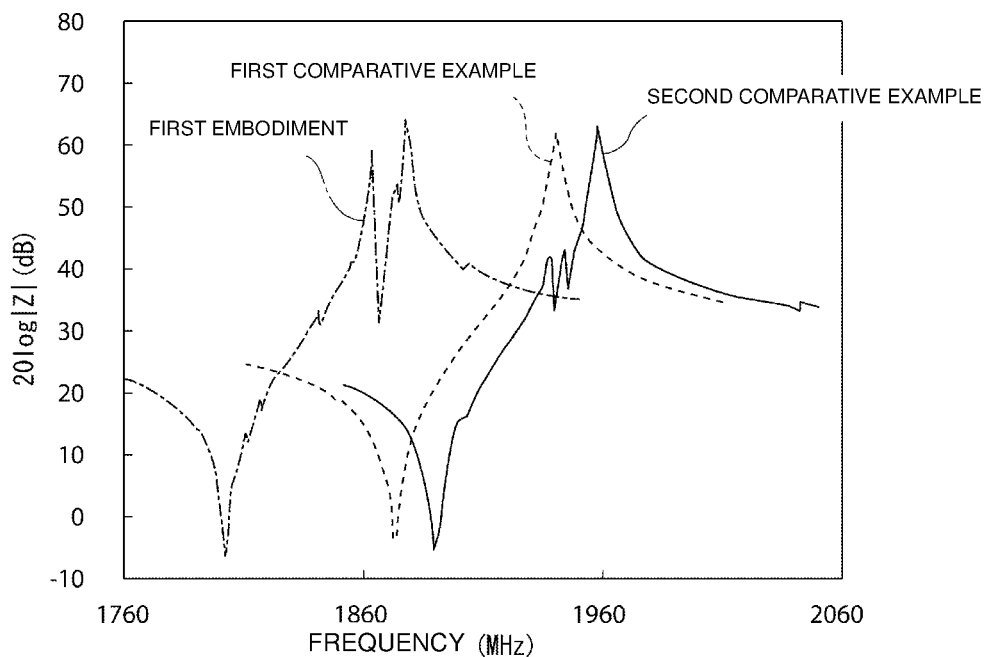
FIG. 5 is a graph showing the results of FEM simulation of impedance characteristics of surface acoustic wave devices according to the first preferred embodiment and the first and second comparative examples.
Figure 6:
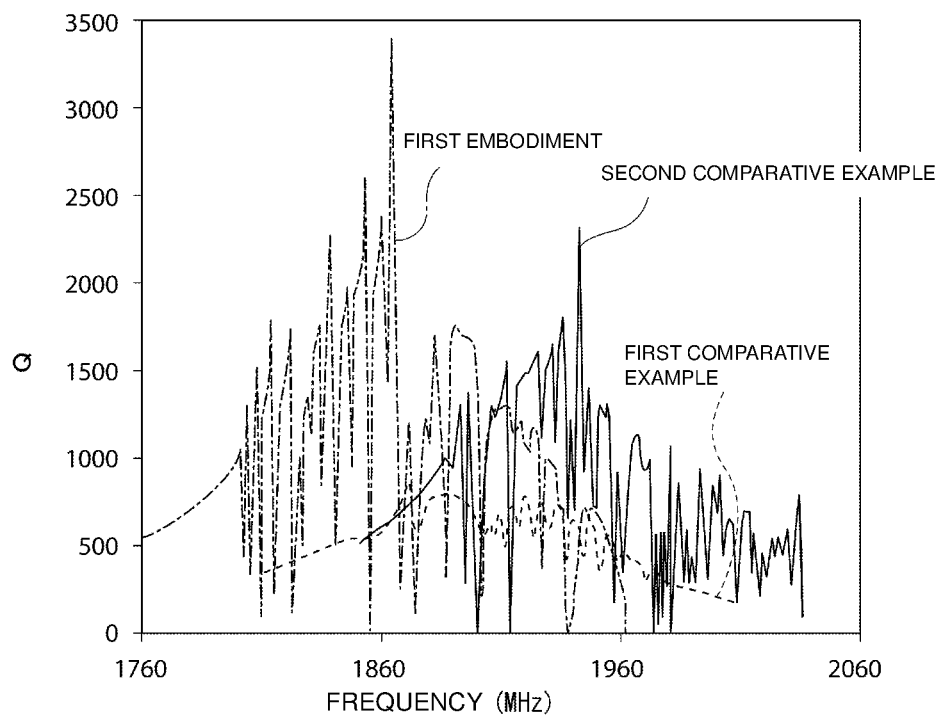
FIG. 6 is a graph showing the results of FEM simulation of the relationship between the Q factor and the frequency in the surface acoustic wave devices of the first preferred embodiment and the first and second comparative examples.

FIGS. 5 and 6 show the results of FEM simulation, in which the dotted-chain line represents the first preferred embodiment, the dashed line represents the first comparative example, and the solid line represents the second comparative example. In the FEM simulation, a one-port resonator is assumed, in which duty=0.5, the intersecting width is 20λ, and the number of pairs is 100.

As in the experimental results described above, in the FEM simulation results, as is clear from FIG. 6, the Q factor can also be increased compared with the first and second comparative examples.

Consequently, as is clear from the experimental results and the FEM simulation results regarding the first preferred embodiment and the first and second comparative examples, it has been confirmed that, by disposing the low-acoustic-velocity film composed of silicon oxide between the high-acoustic-velocity film 3 composed of aluminum nitride and the piezoelectric film 5 composed of LiTaO$_3$, the Q factor can be enhanced. The reason for the fact that the Q factor can be enhanced is believed to be that energy of surface acoustic waves can be effectively confined to the piezoelectric film 5, the low-acoustic-velocity film 4, and the high-acoustic-velocity film 3 by the formation of the high-acoustic-velocity film 3, and that the effect of suppressing leakage of energy of surface acoustic waves outside the IDT electrode can be enhanced by the formation of the low-acoustic-velocity film 4.

Consequently, since the effect is obtained by disposing the low-acoustic-velocity film 4 between the piezoelectric film 5 and the high-acoustic-velocity film 3 as described above, the material constituting the piezoelectric film is not limited to the 38.5° Y cut LiTaO$_3$ described above. The same effect can be obtained in the case where LiTaO$_3$ with other cut angles is used. Furthermore, the same effect can be obtained in the case where a piezoelectric single crystal such as LiNbO$_3$ other than LiTaO$_3$, a piezoelectric thin film such as ZnO or AlN, or a piezoelectric ceramic such as PZT is used.

Furthermore, the high-acoustic-velocity film 3 has a function of confining the majority of energy of surface acoustic waves to a portion in which the piezoelectric film 5 and the low-acoustic-velocity film 4 are stacked. Consequently, the aluminum nitride film may be a c-axis-oriented, anisotropic film. Furthermore, the material for the high-acoustic-velocity film 3 is not limited to the aluminum nitride film, and it is expected that the same effect can be obtained in the case where any of various materials that can constitute the high-acoustic-velocity film 3 described above is used.

Furthermore, silicon oxide of the low-acoustic-velocity film is not particularly limited as long as the acoustic velocity of a bulk wave propagating therein is lower than the acoustic velocity of a bulk wave propagating in the piezoelectric film. Consequently, the material constituting the low-acoustic-velocity film 4 is not limited to silicon oxide. Therefore, any of the various materials described above as examples of a material that can constitute the low-acoustic-velocity film 4 can be used.

Second Preferred Embodiment

Characteristics of a surface acoustic wave device according to a second preferred embodiment having the structure described below were simulated by a finite element method. The electrode structure was the same as that shown in FIG. 1B.

An IDT electrode was an Al film with a thickness of 0.08λ. A piezoelectric film was composed of 38.5° Y cut LiTaO$_3$ film, and the thickness thereof was in a range of 0 to 3λ. A low-acoustic-velocity film was composed of silicon oxide, and the thickness thereof was 0 to 2λ. A high-acoustic-velocity film was composed of aluminum oxide, and the thickness thereof was 1.5λ. A supporting substrate was composed of alumina.

The results are shown in FIGS. 7 to 10.

Figure 7:
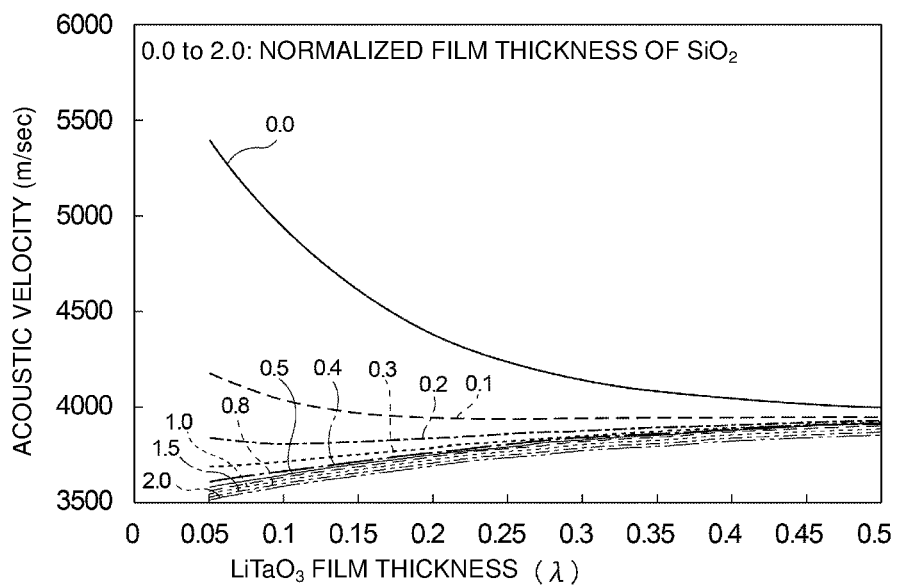
FIG. 7 is a graph showing the relationship between the thickness of the piezoelectric film composed of $LiTaO_3$, the acoustic velocity, and the normalized film thickness of the low-acoustic-velocity film composed of $SiO_2$ in a surface acoustic wave device according to a preferred embodiment of the present invention.

FIG. 7 is a graph showing the relationship between the LiTaO$_3$ film thickness, the acoustic velocity of the U2 mode which is the usage mode, and the normalized film thickness of the silicon oxide film. Furthermore, FIG. 8 is a graph showing the relationship between the LiTaO$_3$ film thickness, the electromechanical coupling coefficient k$^2$ of the U2 mode which is the usage mode, and the normalized film thickness of the silicon oxide film.

As is clear from FIG. 7, by forming the silicon oxide film, the variations in acoustic velocity are small in the wide thickness range of 0.05λ to 0.5λ of the piezoelectric film composed of LiTaO$_3$, in comparison with the case where the normalized film thickness of the silicon oxide film is 0.0, i.e., no silicon oxide film is formed.

Figure 8:
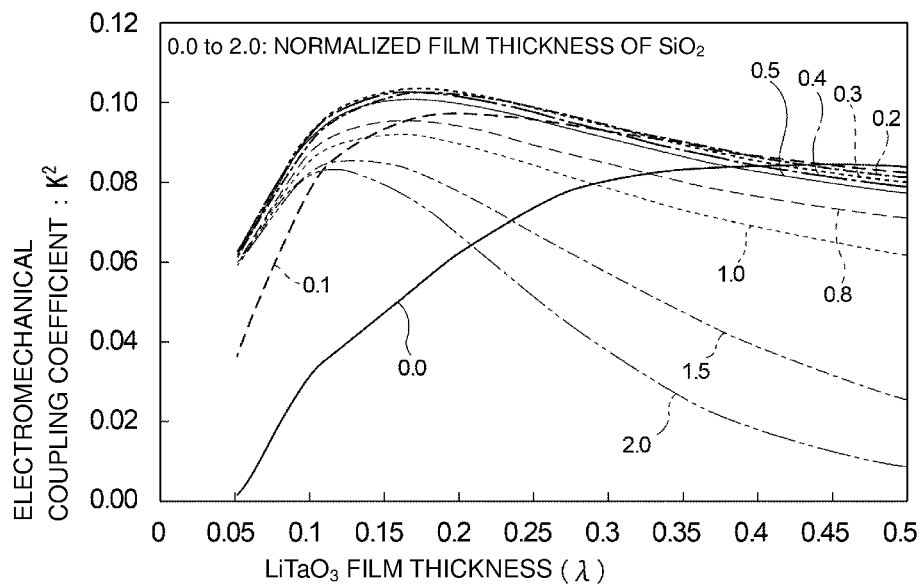
FIG. 8 is a graph showing the relationship between the thickness of the piezoelectric film composed of $LiTaO_3$, the normalized film thickness of the low-acoustic-velocity film composed of $SiO_2$, and the electromechanical coupling coefficient in the surface acoustic wave device according to a preferred embodiment of the present invention.

Furthermore, as is clear from FIG. 8, when the silicon oxide film is formed, even in the case where the LiTaO$_3$ film thickness is small at 0.35λ or less, by controlling the silicon oxide film thickness, the electromechanical coupling coefficient k$^2$ can be increased to 0.08 or more, in comparison with the case where no silicon oxide film is formed.

Figure 9:
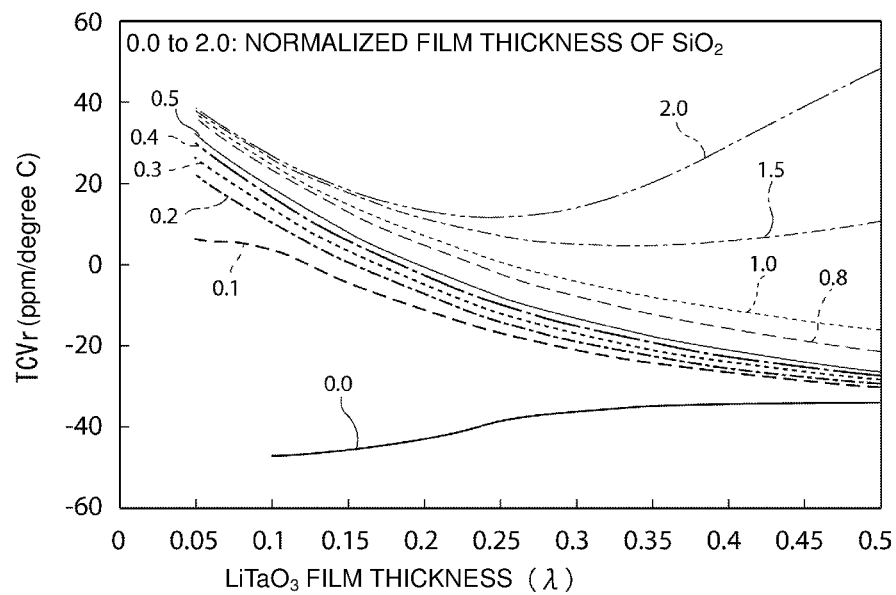
FIG. 9 is a graph showing the relationship between the thickness of the piezoelectric film composed of $LiTaO_3$, the normalized film thickness of the low-acoustic-velocity film composed of $SiO_2$, and the TCV in a surface acoustic wave device according to a preferred embodiment of the present invention.
Figure 10:
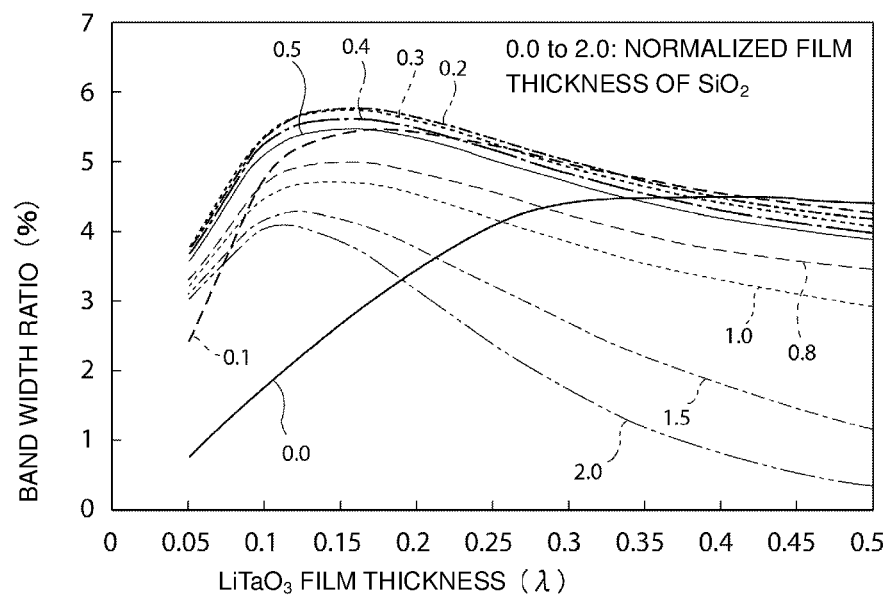
FIG. 10 is a graph showing the relationship between the thickness of the piezoelectric film composed of $LiTaO_3$, the normalized film thickness of the low-acoustic-velocity film composed of $SiO_2$, and the band width ratio in a surface acoustic wave device according to a preferred embodiment of the present invention.

FIG. 9 is a graph showing the relationship between the LiTaO$_3$ film thickness, the temperature coefficient of frequency TCV, and the normalized film thickness of the silicon oxide film. FIG. 10 is a graph showing the relationship between the LiTaO$_3$ film thickness, the band width ratio, and the normalized film thickness of the silicon oxide film.

Note that TCF=TCV−α, where α is the coefficient of linear expansion in the propagation direction. In the case of LiTaO$_3$, α is about 16 ppm/° C.

As is clear from FIG. 9, by forming the silicon oxide film, the absolute value of TCV can be further decreased in comparison with the case where no silicon oxide film is formed. In addition, as is clear from FIG. 10, even in the case where the thickness of the piezoelectric film composed of LiTaO$_3$ is small at about 0.35λ or less, by adjusting the silicon oxide film thickness, the band width ratio can be adjusted.

Furthermore, when the thickness of the silicon oxide film is increased to more than about 2λ, stress is generated, resulting in problems, such as warpage of the surface acoustic wave device, which may cause handling difficulty. Consequently, the thickness of the silicon oxide film is preferably about 2λ or less.

In the related art, it is known that, by using a laminated structure in which an IDT is disposed on LiTaO$_3$ and silicon oxide is further disposed on the IDT, the absolute value of TCF in the surface acoustic wave device can be decreased. However, as is clear from FIG. 11, when the absolute value of TCV is intended to be decreased, i.e., when the absolute value of TCF is intended to be decreased, it is not possible to simultaneously achieve an increase in the bandwidth ratio and a decrease in the absolute value of the TCF. In contrast, by using the structure of the present invention in which the high-acoustic-velocity film and the low-acoustic-velocity film are stacked, a decrease in the absolute value of TCF and an increase in the band width ratio can be achieved. This will be described with reference to FIGS. 11 and 12.

Figure 11:
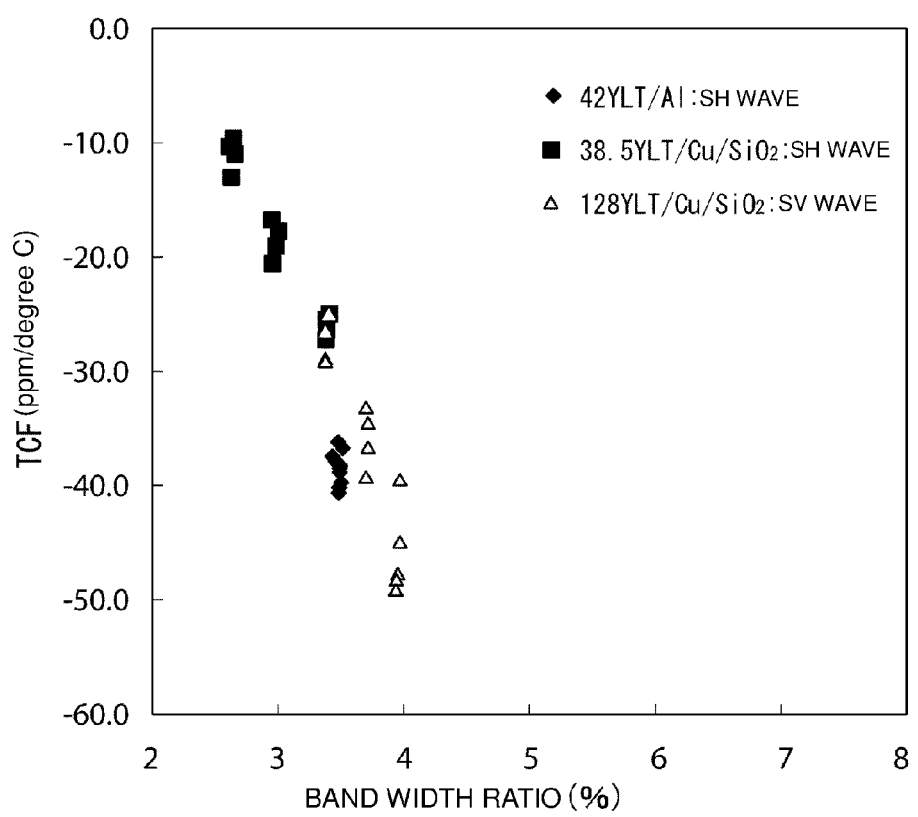
FIG. 11 is a graph showing the relationship between the band width ratio BW and the TCF in surface acoustic wave devices of third to fifth comparative examples.

FIG. 11 is a graph showing the relationship between the band width ratio and the TCF in surface acoustic wave devices of third to fifth comparative examples described below as conventional surface acoustic wave devices.

Third comparative example: laminated structure of electrode composed of Al/42° Y cut LiTaO$_3$. SH wave was used.

Fourth comparative example: laminated structure of silicon oxide film/electrode composed of Cu/38.5° Y cut LiTaO$_3$ substrate. SH wave was used.

Fifth comparative example: laminated structure of silicon oxide film/electrode composed of Cu/128° Y cut LiNbO$_3$ substrate. SV wave was used.

As is clear from FIG. 11, in any of the third comparative example to the fifth comparative example, as the band width ratio BW increases, the absolute value of TCF increases.

Figure 12:
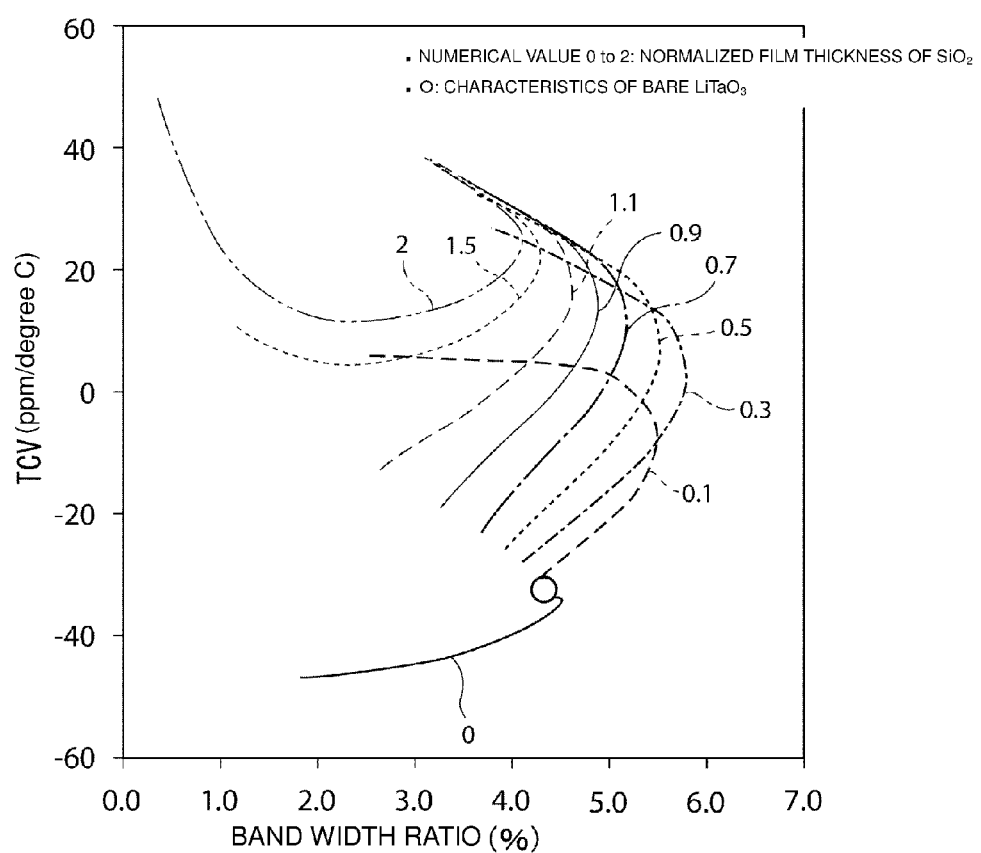
FIG. 12 is a graph showing the relationship between the band width ratio, the temperature coefficient of frequency TCV, and the normalized film thickness of the low-acoustic-velocity film in the surface acoustic wave device of the first preferred embodiment of the present invention.

FIG. 12 is a graph showing the relationship between the band width ratio BW (%) and the temperature coefficient of frequency TCV in the case where the normalized film thickness of LiTaO$_3$ was changed in the range of about 0.1λ to about 0.5λ in each of the thickness levels of the silicon oxide film of the second preferred embodiment. As is clear from FIG. 12, in this preferred embodiment, even in the case where the band width ratio BW is increased, the absolute value of TCV does not increase. That is, by adjusting the thickness of the silicon oxide film, the band width ratio can be increased, and the absolute value of the temperature coefficient of frequency TCV can be decreased.

That is, by stacking the low-acoustic-velocity film 4 and the high-acoustic-velocity film 3 on the piezoelectric film composed of LiTaO$_3$, and in particular, by forming a silicon oxide film as the low-acoustic-velocity film, it is possible to provide an elastic wave device having a wide band width ratio and good temperature characteristics.

Preferably, the coefficient of linear expansion of the supporting substrate 2 is smaller than that of the piezoelectric film 5. As a result, expansion due to heat generated in the piezoelectric film 5 is restrained by the supporting substrate 2. Consequently, the frequency temperature characteristics of the elastic wave device can be further improved.

Figure 13:
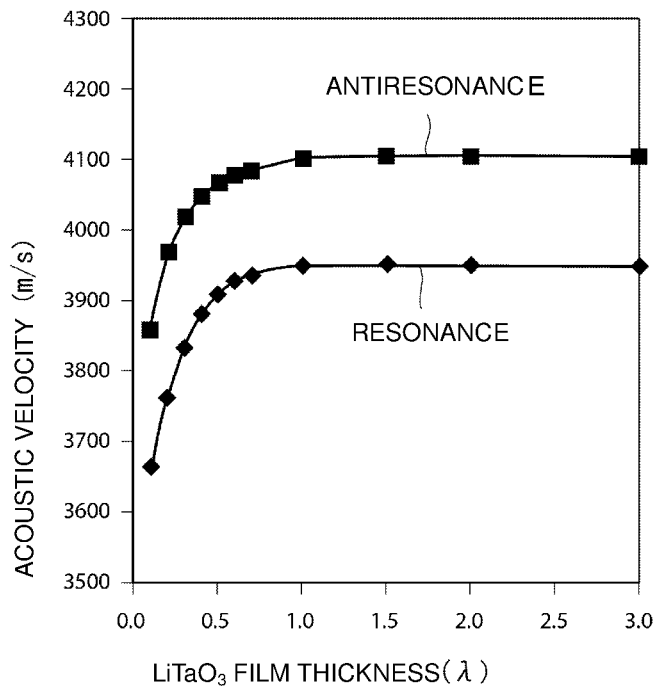
FIG. 13 is a graph showing the relationship between the thickness of the piezoelectric film composed of $LiTaO_3$ and the acoustic velocity at the resonance point as well as the acoustic velocity at the antiresonance point in the surface acoustic wave device according to a second preferred embodiment of the present invention.
Figure 14:
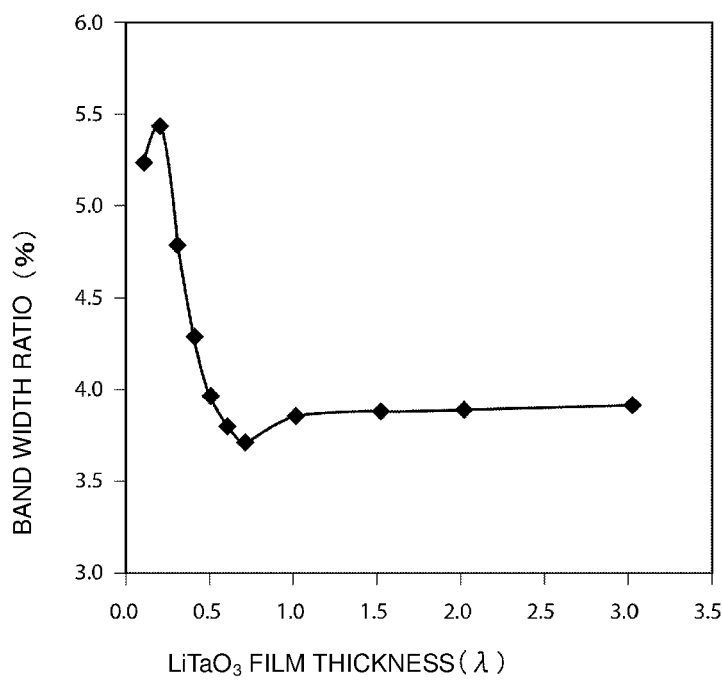
FIG. 14 is a graph showing the relationship between the thickness of the piezoelectric film composed of $LiTaO_3$ and the band width ratio in the surface acoustic wave device according to the second preferred embodiment of the present invention.

FIGS. 13 and 14 are graphs showing changes in the acoustic velocity and changes in the band width ratio, respectively, with changes in the thickness of the piezoelectric film composed of LiTaO$_3$ in the structure of the second preferred embodiment.

As is clear from FIGS. 13 and 14, when the LiTaO$_3$ thickness is about 1.5λ or more, the acoustic velocity and the band width ratio are nearly unchanged. The reason for this is that energy of surface acoustic waves is confined to the piezoelectric film and is not distributed into the low-acoustic-velocity film 4 and the high-acoustic-velocity film 3. Consequently, the effects of the low-acoustic-velocity film 4 and the high-acoustic-velocity film 3 are not exhibited. Therefore, it is more preferable to set the thickness of the piezoelectric film to be about 1.5λ or less. Thereby, it is believed that energy of surface acoustic waves can be sufficiently distributed into the low-acoustic-velocity film 4 and the Q factor can be further enhanced.

The results of FIGS. 7 to 14 show that, by adjusting the thickness of the silicon oxide film and the thickness of the piezoelectric film composed of LiTaO$_3$, the electromechanical coupling coefficient can be adjusted over a wide range. Furthermore, it is clear that when the thickness of the piezoelectric film composed of LiTaO$_3$ is in the range of about 0.05λ to about 0.5λ, the electromechanical coupling coefficient can be adjusted in a wider range. Consequently, the thickness of the piezoelectric film composed of LiTaO$_3$ is preferably in the range of about 0.05λ to about 0.5λ.

Conventionally, it has been required to adjust cut angles of the piezoelectric used in order to adjust the electromechanical coupling coefficient. However, when the cut angles, i.e., Euler angles, are changed, other material characteristics, such as the acoustic velocity, temperature characteristics, and spurious characteristics, are also changed. Consequently, it has been difficult to simultaneously satisfy these characteristics, and optimization of design has been difficult.

However, as is clear from the results of the second preferred embodiment described above, according to the present invention, even in the case where a piezoelectric single crystal with the same cut angles is used as the piezoelectric film, by adjusting the thickness of the silicon oxide film, i.e., the low-acoustic-velocity film, and the thickness of the piezoelectric film, the electromechanical coupling coefficient can be freely adjusted. Consequently, freedom of design can be greatly increased. Therefore, it is enabled to simultaneously satisfy various characteristics, such as the acoustic velocity, the electromechanical coupling coefficient, frequency temperature characteristics, and spurious characteristics, and it is possible to easily provide a surface acoustic wave device having desired characteristics.

Third Preferred Embodiment

As a third preferred embodiment, surface acoustic wave devices same as those of the first preferred embodiment were fabricated. The materials and thickness were as described below.

A laminated structure included an Al film with a thickness of 0.08λ as an IDT electrode 6/a LiTaO$_3$ film with a thickness of 0.25λ as a piezoelectric film 4/a silicon oxide film with a thickness in the range of 0 to 2λ as a low-acoustic-velocity film 4/a high-acoustic-velocity film. As the high-acoustic-velocity film, a silicon nitride film, an aluminum oxide film, or diamond was used. The thickness of the high-acoustic-velocity film 3 was 1.5λ.

Figure 15:
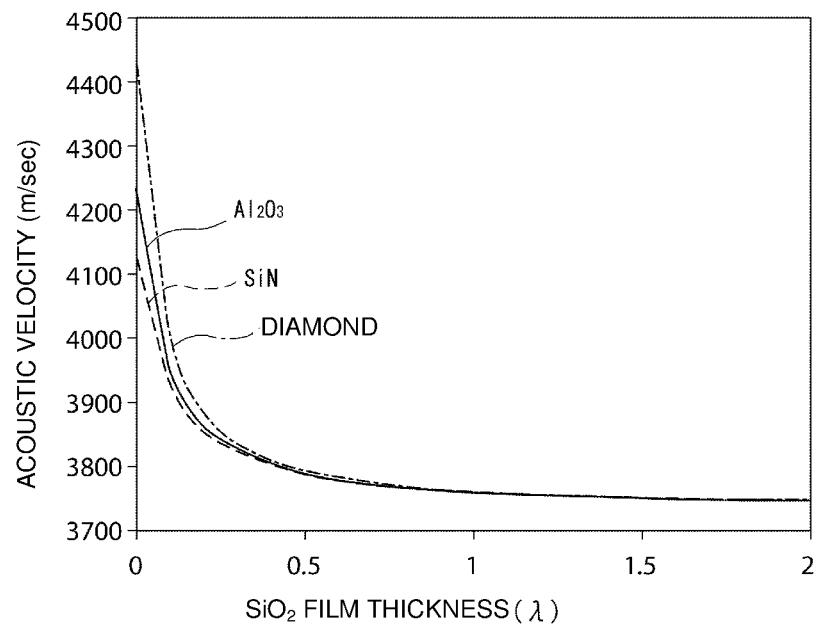
FIG. 15 is a graph showing the relationship between the normalized film thickness of the $SiO_2$ film and the material for the high-acoustic-velocity film in surface acoustic wave devices according to a third preferred embodiment of the present invention.
Figure 16:
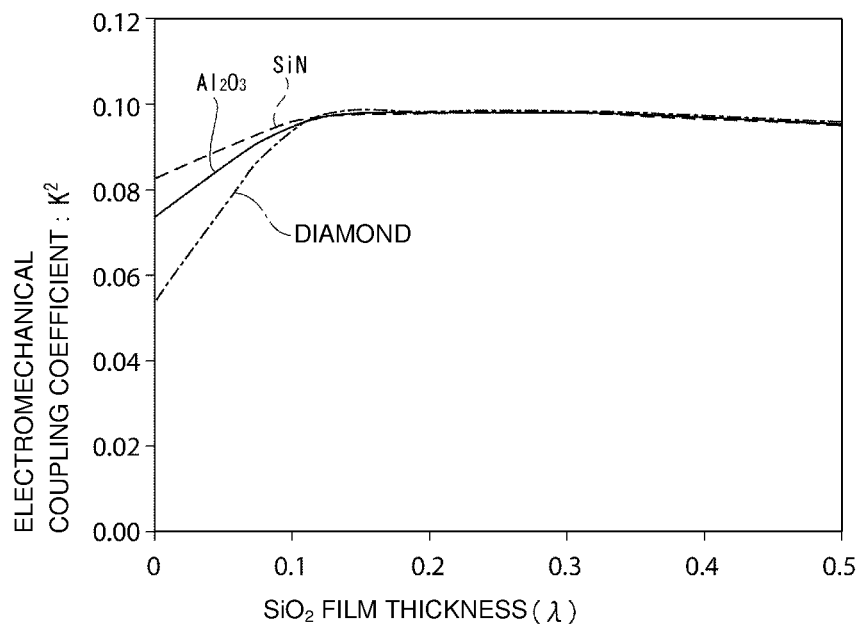
FIG. 16 is a graph showing the relationship between the normalized film thickness of the $SiO_2$ film, the electromechanical coupling coefficient, and the material for the high-acoustic-velocity film in surface acoustic wave devices according to the third preferred embodiment of the present invention.

FIGS. 15 and 16 are graphs showing the relationship between the thickness of the silicon oxide film and the acoustic velocity and the relationship between the thickness of the silicon oxide film and the electromechanical coupling coefficient k$^2$, respectively, in the third preferred embodiment.

The acoustic velocity of the bulk wave (S wave) in the silicon nitride film is 6,000 m/sec, and the acoustic velocity of the bulk wave (S wave) in aluminum oxide is 6,000 m/sec. Furthermore, the acoustic velocity of the bulk wave (S wave) in diamond is 12,800 m/sec.

As is clear from FIGS. 15 and 16, as long as the high-acoustic-velocity film 4 satisfies the conditions for the high-acoustic-velocity film 4 described earlier, even if the material for the high-acoustic-velocity film 4 and the thickness of the silicon oxide film are changed, the electromechanical coupling coefficient and the acoustic velocity are nearly unchanged. In particular, if the thickness of the silicon oxide film is about 0.1λ or more, the electromechanical coupling coefficient is nearly unchanged in the silicon oxide film thickness range of about 0.1λ to about 0.5λ regardless of the material for the high-acoustic-velocity film. Furthermore, as is clear from FIG. 15, in the silicon oxide film thickness range of about 0.3λ to about 2λ, the acoustic velocity is nearly unchanged regardless of the material for the high-acoustic-velocity film.

Consequently, in the present invention, the material for the high-acoustic-velocity film is not particularly limited as long as the above conditions are satisfied.

Fourth Preferred Embodiment

In a fourth preferred embodiment, while changing the Euler angles (0°, θ, ψ) of the piezoelectric film, the electromechanical coupling coefficient of a surface acoustic wave containing as a major component the U2 component (SH component) was measured.

A laminated structure was composed of IDT electrode 6/piezoelectric film 5/low-acoustic-velocity film 4/high-acoustic-velocity film 3/supporting substrate 2. As the IDT electrode 6, Al with a thickness of 0.08λ was used. As the piezoelectric film, LiTaO$_3$ with a thickness of 0.25λ was used. As the low-acoustic-velocity film 4, silicon oxide with a thickness of 0.35λ was used. As the high-acoustic-velocity film 3, an aluminum nitride film with a thickness of 1.5λ was used. As the supporting substrate 2, glass was used.

In the structure described above, regarding many surface acoustic wave devices with Euler angles (0°, θ, ψ) in which θ and ψ were varied, the electromechanical coupling coefficient was obtained by FEM. As a result, it was confirmed that in a plurality of regions R1 shown in FIG. 17, the electromechanical coupling coefficient k$^2$ of the mode mainly composed of the U2 component (SH component) is about 2% or more. Note that the same results were obtained in the range of Euler angles (0°±5, θ, ψ).

Figure 17:
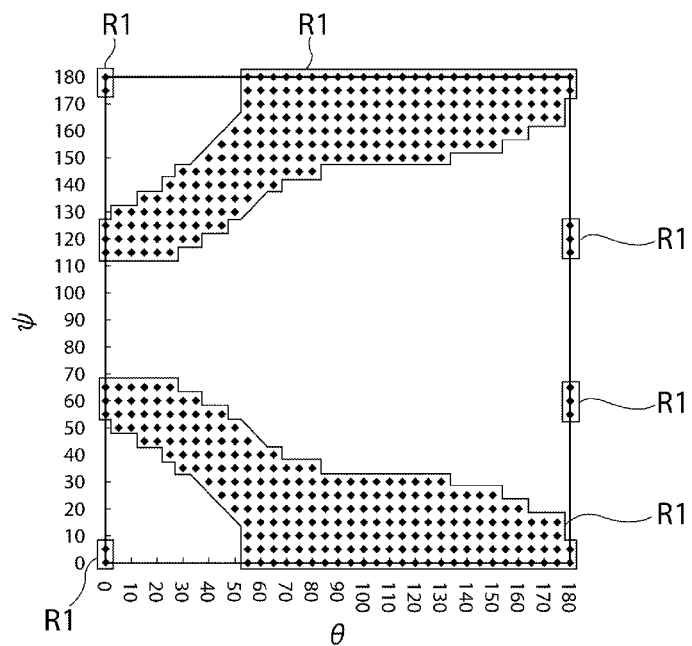
FIG. 17 is a graph showing a plurality of regions R1 in which the electromechanical coupling coefficient of the surface acoustic wave mode containing as a major component the U2 (SH) mode preferably is about 2% or more in the $LiTaO_3$ films with Euler angles (0±5°, θ, ψ) of surface acoustic wave devices according to a fourth preferred embodiment of the present invention.

That is, when LiTaO$_3$ with Euler angles located in a plurality of ranges R1 shown in FIG. 17 is used, the electromechanical coupling coefficient of the vibration mainly composed of the U2 component is about 2% or more. Therefore, it is clear that a bandpass filter with a wide band width can be configured using a surface acoustic wave device according to a preferred embodiment of the present invention.

Fifth Preferred Embodiment

Figure 18:
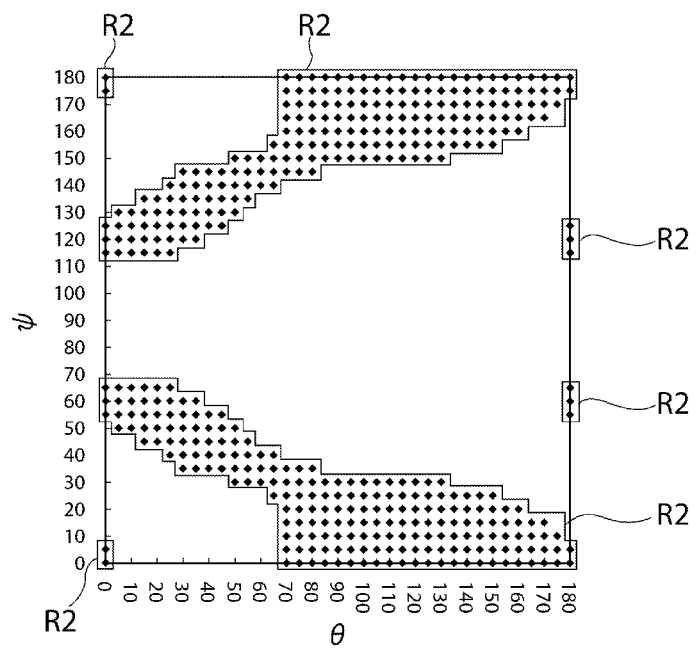
FIG. 18 is a graph showing a plurality of regions R2 in which the electromechanical coupling coefficient of the surface acoustic wave mode containing as a major component the U2 mode preferably is about 2% or more and the electromechanical coupling coefficient of the surface acoustic wave mode containing as a major component the U3 (SV) mode, which is spurious, preferably is about 1% or less in the $LiTaO_3$ films with Euler angles (0±5°, θ, ψ) of surface acoustic wave devices according to the fifth preferred embodiment of the present invention.

Assuming the same structure as that in the fourth preferred embodiment, the electromechanical coupling coefficient of a surface acoustic wave mainly composed of the U3 component (SV component) was obtained by FEM. The range of Euler angles in which the electromechanical coupling coefficient of the mode mainly composed of the U2 (SH component) is about 2% or more, and the electromechanical coupling coefficient of the mode mainly composed of the U3 (SV component) is about 1% or less was obtained. The results are shown in FIG. 18. In a plurality of ranges R2 shown in FIG. 18, the electromechanical coupling coefficient of the mode mainly composed of the U2 (SH component) is about 2% or more, and the electromechanical coupling coefficient of the mode mainly composed of the U3 (SV component) is about 1% or less. Consequently, by using LiTaO$_3$ with Euler angles located in any one of a plurality of regions R2, the electromechanical coupling coefficient of the U2 mode used can be increased and the electromechanical coupling coefficient of the U3 mode which is spurious can be decreased. Therefore, it is possible to configure a bandpass filter having better filter characteristics.

Sixth Preferred Embodiment

As in the second preferred embodiment, simulation was carried out on a surface acoustic wave device having the structure described below. As shown in Table 4 below, in the case where the transversal wave acoustic velocity of the low-acoustic-velocity film and the specific acoustic impedance of the transversal wave of the low-acoustic-velocity film were changed in 10 levels, characteristics of surface acoustic waves mainly composed of the U2 component were simulated by a finite element method. In the transversal wave acoustic velocity and specific acoustic impedance of the low-acoustic-velocity film, the density and elastic constant of the low-acoustic-velocity film were changed. Furthermore, as the material constants of the low-acoustic-velocity film not shown in Table 4, material constants of silicon oxide were used.

TABLE 4

| Level | Specific gravity ρ [kg/m$^3$] | Elastic constant C11 [N/m$^2$] | Elastic constant C44 [N/m$^2$] | Transversal wave acoustic velocity V [m/s] | Specific acoustic impedance of transversal wave Zs [N · s/m$^3$] | Remarks |
|---|---|---|---|---|---|---|
| 1 | 1.11E+03 | 4.73E+10 | 1.56E+10 | 3757 | 4.2.E+06 | |
| 2 | 2.21E+03 | 7.85E+10 | 3.12E+10 | 3757 | 8.3.E+06 | Silicon oxide equivalent |
| 3 | 3.32E+03 | 1.10E+11 | 4.68E+10 | 3757 | 1.2.E+07 | |
| 4 | 6.63E+03 | 2.03E+11 | 9.36E+10 | 3757 | 2.5.E+07 | |
| 5 | 1.11E+04 | 3.28E+11 | 1.56E+11 | 3757 | 4.2.E+07 | |
| 6 | 2.21E+03 | 3.17E+10 | 7.80E+09 | 1879 | 4.2.E+06 | |
| 7 | 4.42E+03 | 4.73E+10 | 1.56E+10 | 1879 | 8.3.E+06 | |
| 8 | 6.63E+03 | 6.29E+10 | 2.34E+10 | 1879 | 1.2.E+07 | |
| 9 | 1.33E+04 | 1.10E+11 | 4.68E+10 | 1879 | 2.5.E+07 | |
| 10 | 2.21E+04 | 1.72E+11 | 7.80E+10 | 1879 | 4.2.E+07 | |

Note that, in Table 4, 1.11E+03 means $1.11 \times 10^3$. That is, aE+b represents $a \times 10^b$.

The electrode structure was the same as that shown in FIG. 1B, and the surface acoustic wave device had a laminated structure of IDT electrode/piezoelectric film/low-acoustic-velocity film/high-acoustic-velocity film/supporting substrate. The IDT electrode was an Al film with a thickness of 0.08λ. The piezoelectric film was composed of 40° Y cut LiTaO$_3$. In each of the cases where the thickness of the piezoelectric film was 0.1λ, 0.4λ, and 0.6λ, 10 levels shown in Table 4 were calculated. The thickness of the low-acoustic-velocity film was 0.4λ. The high-acoustic-velocity film was composed of aluminum oxide, and the thickness thereof was 1.5λ. The supporting substrate was composed of an alumina substrate.

Figure 19A:
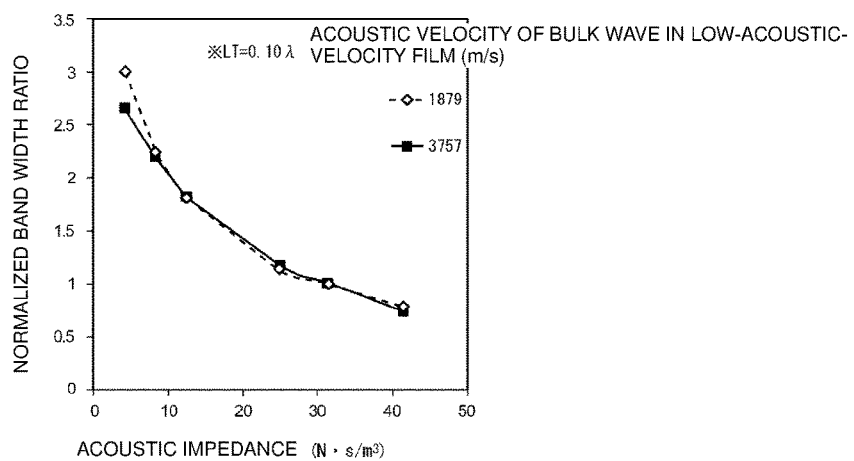
FIGS. 19A to 19C are graphs showing the relationships between the specific acoustic impedance of the low-acoustic-velocity film and the band width ratio in surface acoustic wave devices according to a sixth preferred embodiment of the present invention.
Figure 19B:
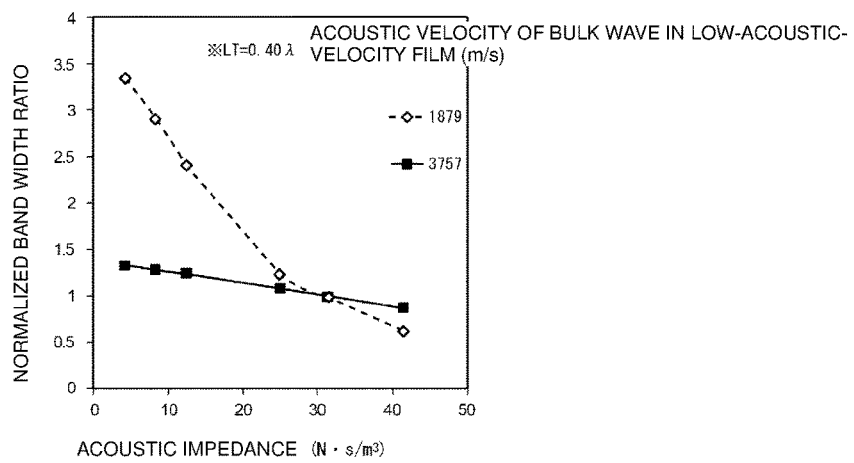
Figure 19C:
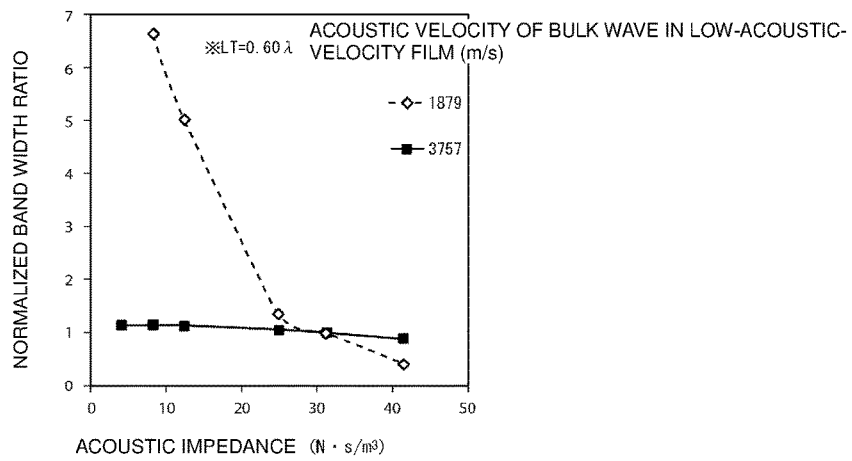

FIGS. 19A to 19C are graphs showing the relationships between the specific acoustic impedance of the low-acoustic-velocity film and the band width ratio in the sixth preferred embodiment. In the graphs, each level shows the behavior in the case where the acoustic velocity of the transversal wave in the low-acoustic-velocity film changes, and the band width ratio in each level is normalized to the band width ratio in the case where the specific acoustic impedance of the piezoelectric film is equal to the specific acoustic impedance of the low-acoustic-velocity film. The specific acoustic impedance is expressed as a product of the acoustic velocity of the bulk wave and the density of the medium. In the sixth preferred embodiment, the bulk wave of the piezoelectric film is the SH bulk wave, the acoustic velocity is 4,212 m/s, and the density is $7.454 \times 10^3$ kg/m$^3$. Consequently, the specific acoustic impedance of the piezoelectric film is $3.14 \times 10^7$ N·s/m$^3$. Furthermore, regarding the acoustic velocity of the bulk wave used for calculating the specific acoustic impedance of each of the low-acoustic-velocity film and the piezoelectric film, for the dominant mode of the elastic wave shown in the left column of Table 1 or 2, the acoustic velocity is determined according to the mode of the bulk wave shown in the right column of Table 1 or 2.

Figure 20A:
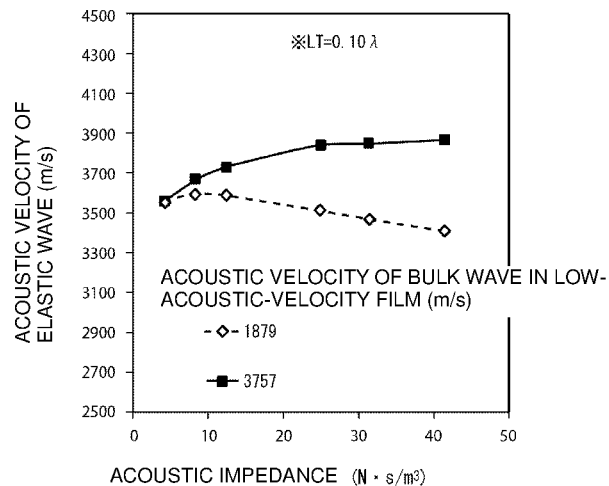
FIGS. 20A to 20C are graphs showing the relationships between the specific acoustic impedance of the low-acoustic-velocity film and the acoustic velocity of the surface acoustic wave in surface acoustic wave devices according to the sixth preferred embodiment of the present invention.
Figure 20B:
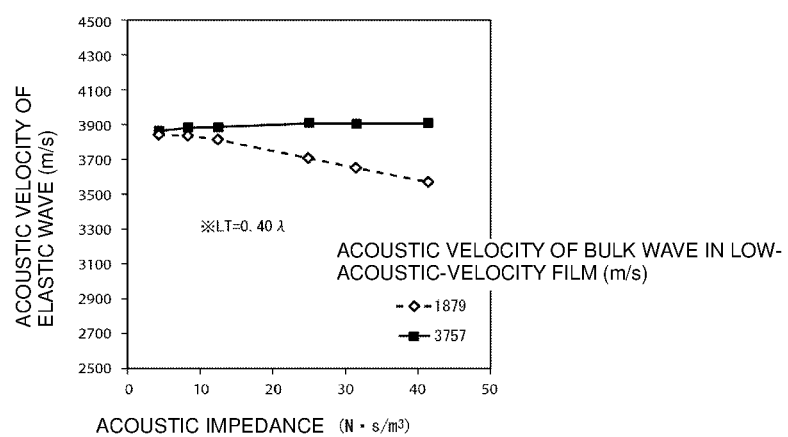
Figure 20C:
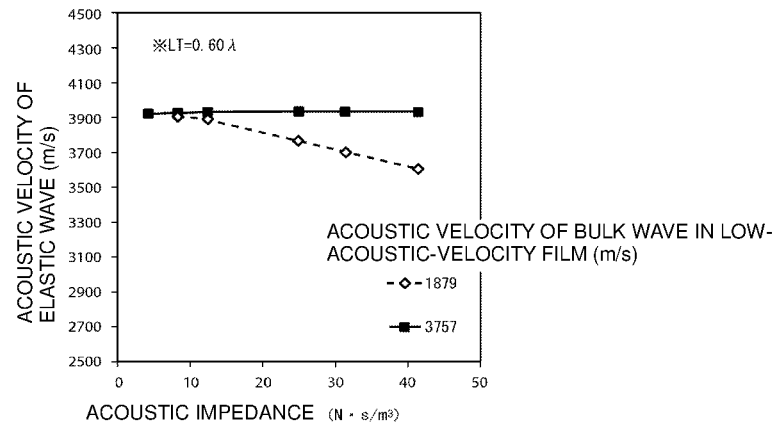

Furthermore, FIGS. 20A to 20C are graphs showing the relationships between the specific acoustic impedance of the transversal wave of the low-acoustic-velocity film and the acoustic velocity of the propagating surface acoustic wave in the sixth preferred embodiment.

As is clear from FIGS. 19A to 19C, regardless of the thickness of the piezoelectric film, the band width ratio increases as the specific acoustic impedance of the low-acoustic-velocity film becomes smaller than the specific acoustic impedance of the piezoelectric film. The reason for this is that since the specific acoustic impedance of the low-acoustic-velocity film is smaller than the specific acoustic impedance of the piezoelectric film, the displacement of the piezoelectric film under certain stress increases, thus generating a larger electric charge, and therefore, equivalently higher piezoelectricity can be obtained. That is, since this effect is obtained depending only on the magnitude of specific acoustic impedance, regardless of the vibration mode of the surface acoustic wave, the type of the piezoelectric film, or the type of the low-acoustic-velocity film, it is possible to obtain a surface acoustic wave device having a higher band width ratio when the specific acoustic impedance of the low-acoustic-velocity film is smaller than the specific impedance of the piezoelectric film.

In each of the first to sixth preferred embodiments of the present invention, the IDT electrode 6, the piezoelectric film 5, the low-acoustic-velocity film 4, the high-acoustic-velocity film 3, and the supporting substrate 2 preferably are stacked in that order from the top, for example. However, within the extent that does not greatly affect the propagating surface acoustic wave and boundary wave, an adhesion layer composed of Ti, NiCr, or the like, an underlying film, or any medium may be disposed between the individual layers. In such a case, the same effect can be obtained. For example, a new high-acoustic-velocity film which is sufficiently thin compared with the wavelength of the surface acoustic wave may be disposed between the piezoelectric film 5 and the low-acoustic-velocity film 4. In such a case, the same effect can be obtained. Furthermore, energy of the mainly used surface acoustic wave is not distributed between the high-acoustic-velocity film 3 and the supporting substrate 2. Consequently, any medium with any thickness may be disposed between the high-acoustic-velocity film and the supporting substrate 2. In such a case, the same advantageous effects can be obtained.

The seventh and eighth preferred embodiments described below relate to surface acoustic wave devices provided with such a medium layer.

Seventh Preferred Embodiment

Figure 23:
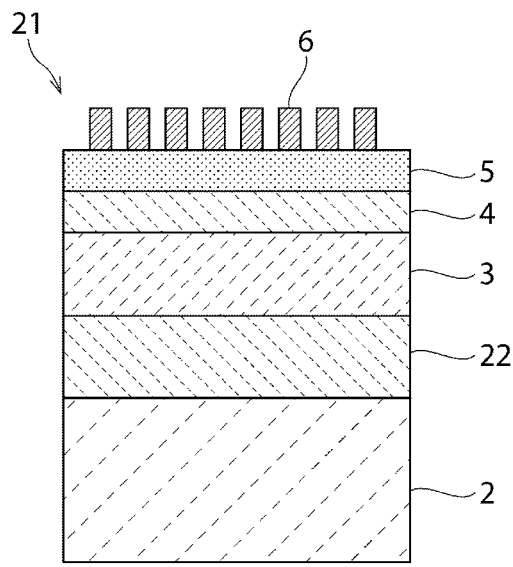
FIG. 23 is a schematic elevational cross-sectional view of a surface acoustic wave device according to a seventh preferred embodiment of the present invention.

In a surface acoustic wave device 21 according to a seventh preferred embodiment shown in FIG. 23, a medium layer 22 is disposed between a supporting substrate 2 and a high-acoustic-velocity film 3. The structure other than this is the same as that in the first preferred embodiment. Therefore, the description of the first preferred embodiment is incorporated herein. In the surface acoustic wave device 21, an IDT electrode 6, a piezoelectric film 5, a low-acoustic-velocity film 4, the high-acoustic-velocity film 3, the medium layer 22, and the supporting substrate 2 are stacked in that order from the top.

As the medium layer 22, any material, such as a dielectric, a piezoelectric, a semiconductor, or a metal, may be used. Even in such a case, the same effect as that of the first preferred embodiment can be obtained. In the case where the medium layer 22 is composed of a metal, the band width ratio can be decreased. Consequently, in the application in which the band width ratio is small, the medium layer 22 is preferably composed of a metal.

Eighth Preferred Embodiment

Figure 24:
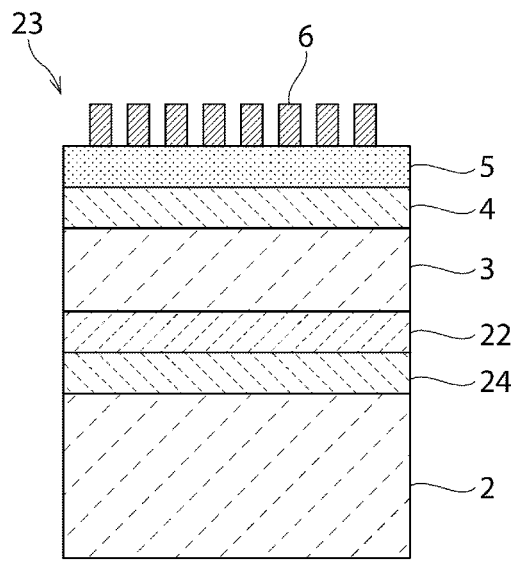
FIG. 24 is a schematic elevational cross-sectional view of a surface acoustic wave device according to an eighth preferred embodiment of the present invention.

In a surface acoustic wave device 23 according to an eighth preferred embodiment shown in FIG. 24, a medium layer 22 and a medium layer 24 are disposed between a supporting substrate 2 and a high-acoustic-velocity film 3. That is, an IDT electrode 6, a piezoelectric film 5, a low-acoustic-velocity film 4, the high-acoustic-velocity film 3, the medium layer 22, the medium layer 24, and the supporting substrate 2 are stacked in that order from the top. Other than the medium layer 22 and the medium layer 24, the structure is the same as that in the first preferred embodiment.

The medium layers 22 and 24 may be composed of any material, such as a dielectric, a piezoelectric, a semiconductor, or a metal. Even in such a case, in the eighth preferred embodiment, it is possible to obtain the same effect as that of the surface acoustic wave device of the first preferred embodiment.

In this preferred embodiment, after a laminated structure including the piezoelectric film 5, the low-acoustic-velocity film 4, the high-acoustic-velocity film 3, and the medium layer 22 and a laminated structure including the medium layer 24 and the supporting substrate 2 are separately fabricated, both laminated structures are bonded to each other. Then, the IDT electrode 6 is formed on the piezoelectric film 5. As a result, it is possible to obtain a surface acoustic wave device according to this preferred embodiment without being restricted by manufacturing conditions when each laminated structure is fabricated. Consequently, freedom of selection for materials constituting the individual layers can be increased.

When the two laminated structures are bonded to each other, any joining method can be used. For such a bonded structure, various methods, such as bonding by hydrophilization, activation bonding, atomic diffusion bonding, metal diffusion bonding, anodic bonding, bonding using a resin or SOG, can be used. Furthermore, the joint interface between the two laminated structures is located on the side opposite to the piezoelectric film 5 side of the high-acoustic-velocity film 3. Consequently, the joint interface exists in the portion below the high-acoustic-velocity film 3 in which major energy of the surface acoustic wave used is not distributed. Therefore, surface acoustic wave propagation characteristics are not affected by the quality of the joint interface. Accordingly, it is possible to obtain stable and good resonance characteristics and filter characteristics.

Ninth Preferred Embodiment

Figure 25:
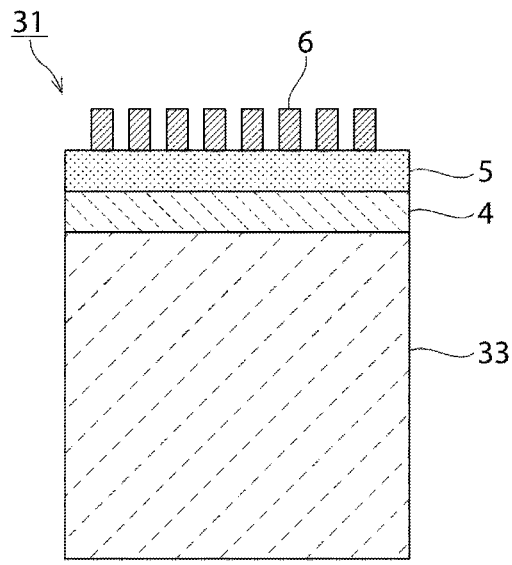
FIG. 25 is a schematic elevational cross-sectional view of a surface acoustic wave device according to a ninth preferred embodiment of the present invention.

In a surface acoustic wave device 31 shown in FIG. 25, an IDT electrode 6, a piezoelectric film 5, a low-acoustic-velocity film 4, and a high-acoustic-velocity supporting substrate 33 which also functions as a high-acoustic-velocity film are stacked in that order from the top. That is, the high-acoustic-velocity supporting substrate 33 serves both as the high-acoustic-velocity film 3 and as the supporting substrate 2 in the first preferred embodiment. Consequently, the acoustic velocity of a bulk wave in the high-acoustic-velocity supporting substrate 33 is set to be higher than the acoustic velocity of a surface acoustic wave propagating in the piezoelectric film 5. Thus, the same effect as that in the first preferred embodiment can be obtained. Moreover, since the high-acoustic-velocity supporting substrate 33 serves both as the high-acoustic-velocity film and as the supporting substrate, the number of components can be reduced.

Tenth Preferred Embodiment

In a tenth preferred embodiment, the relationship between the Q factor and the frequency in a one-port-type surface acoustic wave resonator as a surface acoustic wave device was simulated by FEM.

Here, as the surface acoustic wave device according to the first preferred embodiment, shown in FIGS. 1A and 1B, the following structure was assumed.

The structure included an IDT electrode 6 composed of Al with a thickness of $0.1\lambda$, a piezoelectric film composed of a 50° Y cut $LiTaO_3$ film, an $SiO_2$ film as a low-acoustic-velocity film, an aluminum nitride film with a thickness of $1.5\lambda$ as a high-acoustic-velocity film, an $SiO_2$ film with a thickness of $0.3\lambda$, and a supporting substrate composed of alumina stacked in that order from the top. In this simulation, the thickness of the $LiTaO_3$ film as the piezoelectric film was changed to $0.15\lambda$, $0.20\lambda$, $0.25\lambda$, or $0.30\lambda$. Furthermore, the thickness of the $SiO_2$ film as the low-acoustic-velocity film was changed in the range of 0 to $2\lambda$.

The duty of the IDT electrode was 0.5, the intersecting width of electrode fingers was $20\lambda$, and the number of electrode finger pairs was 100.

For comparison, a one-port-type surface acoustic wave resonator, in which an IDT electrode composed of Al with a thickness of $0.1\lambda$ and a 38.5° Y cut $LiTaO_3$ substrate were stacked in that order from the top, was prepared. That is, in the comparative example, an electrode structure including the IDT electrode composed of Al is disposed on a 38.5° Y cut $LiTaO_3$ substrate with a thickness of 350 μm.

Regarding the surface acoustic wave devices according to the tenth preferred embodiment and the comparative example, the relationship between the Q factor and the frequency was obtained by simulation by FEM. In the range from the resonant frequency at which the impedance of the one-port resonator was lowest to the antiresonant frequency at which the impedance was highest, the highest Q factor was defined as the $Q_{max}$ factor. A higher $Q_{max}$ factor indicates lower loss.

Figure 26:
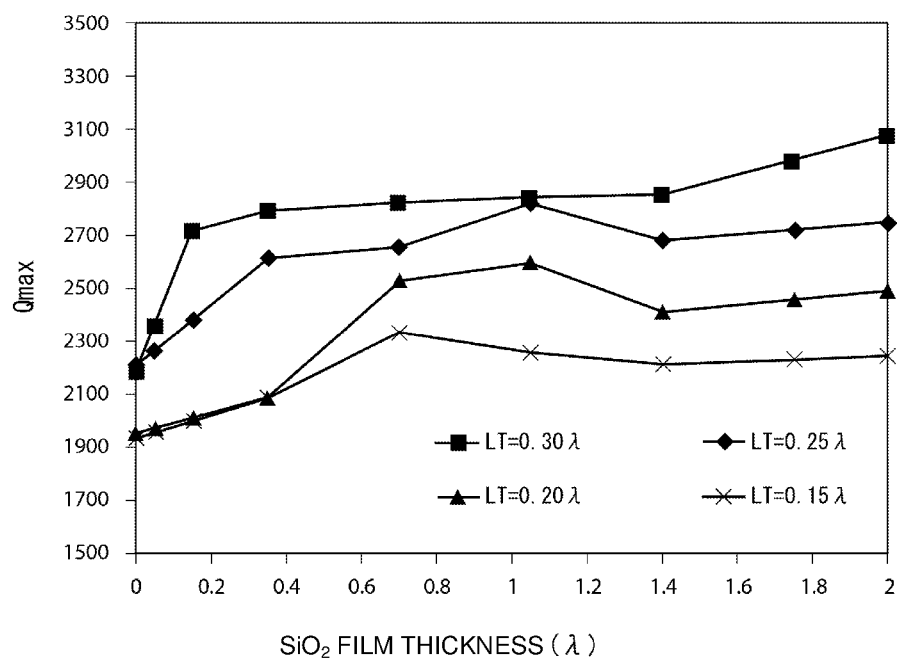
FIG. 26 is a graph showing the relationship between the $SiO_2$ film thickness and the $Q_{max}$ factor in the case where the thickness of piezoelectric thin films of surface acoustic wave devices according to a tenth preferred embodiment of the present invention is changed.

The $Q_{max}$ factor of the comparative example was 857. FIG. 26 shows the relationship between the LiTaO$_3$ film thickness, the SiO$_2$ film thickness, and the $Q_{max}$ in this preferred embodiment.

As is clear from FIG. 26, in each case where the LiTaO$_3$ film thickness is 0.15λ, 0.20λ, 0.25λ, or 0.30λ, the $Q_{max}$ factor increases when the thickness of the low-acoustic-velocity film composed of SiO$_2$ exceeds 0. It is also clear that in the tenth preferred embodiment, in any of the cases, the $Q_{max}$ factor is effectively enhanced relative to the comparative example.

Preferred Embodiment of Manufacturing Method

The elastic wave device according to the first preferred embodiment includes, as described above, the high-acoustic-velocity film 3, the low-acoustic-velocity film 4, the piezoelectric film 5, and the IDT electrode 6 which are disposed on the supporting substrate 2. The method for manufacturing such an elastic wave device is not particularly limited. By using a manufacturing method using the ion implantation process described below, it is possible to easily obtain an elastic wave device 1 having a piezoelectric film with a small thickness. A preferred embodiment of the manufacturing method will be described with reference to FIGS. 21A-21E and 22A-22C.

Figure 21A:
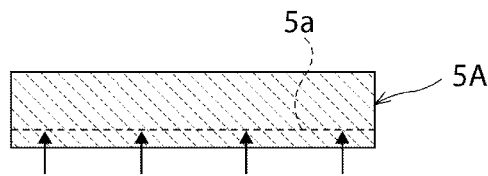
FIGS. 21A to 21E are elevational cross-sectional views for explaining a method for manufacturing a surface acoustic wave device according to the first preferred embodiment of the present invention.

First, as shown in FIG. 21A, a piezoelectric substrate 5A is prepared. In this preferred embodiment, the piezoelectric substrate 5A is preferably composed of LiTaO$_3$. Hydrogen ions are implanted from a surface of the piezoelectric substrate 5A. The ions to be implanted are not limited to hydrogen, and helium or the like may be used.

In the ion implantation, energy is not particularly limited. In this preferred embodiment, preferably the energy is about 107 KeV, and the dose amount is about 8×10$^{16}$ atoms/cm$^2$, for example.

When ion implantation is performed, the ion concentration is distributed in the thickness direction in the piezoelectric substrate 5A. In FIG. 21A, the dashed line represents a region in which the ion concentration is highest. In a high concentration ion-implanted region 5a in which the ion concentration is highest represented by the dashed line, when heating is performed as will be described later, separation easily occurs owing to stress. Such a method in which separation is performed using the high concentration ion-implanted region 5a is disclosed in Japanese Unexamined Patent Application Publication No. 2002-534886.

In this step, at the high concentration ion-implanted region 5a, the piezoelectric substrate 5A is separated to obtain a piezoelectric film 5. The piezoelectric film 5 is a layer between the high concentration ion-implanted region 5a and the surface of the piezoelectric substrate from which ion implantation is performed. In some cases, the piezoelectric film 5 may be subjected to machining, such as grinding. Consequently, the distance from the high concentration ion-implanted region 5a to the surface of the piezoelectric substrate on the ion implantation side is set to be equal to or slightly larger than the thickness of the finally formed piezoelectric film.

Figure 21B:
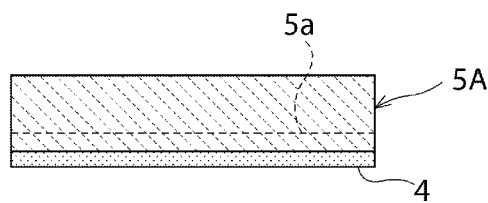

Next, as shown in FIG. 21B, a low-acoustic-velocity film 4 is formed on the surface of the piezoelectric substrate 5A on which the ion implantation has been performed. In addition, a low-acoustic-velocity film formed in advance may be bonded to the piezoelectric substrate 5A using a transfer method or the like.

Figure 21C:
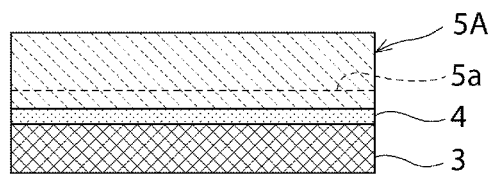

Next, as shown in FIG. 21C, a high-acoustic-velocity film 3 is formed on a surface of the low-acoustic-velocity film 4, opposite to the piezoelectric substrate 5A side of the low-acoustic-velocity film 4. Instead of using the film formation method, the high-acoustic-velocity film 3 may also be bonded to the low-acoustic-velocity film 4 using a transfer method or the like.

Figure 21D:
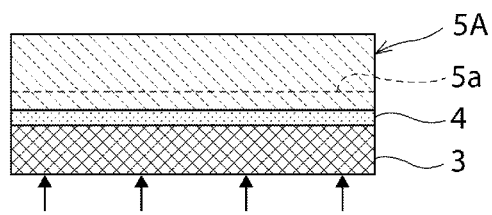

Furthermore, as shown in FIG. 21D, an exposed surface of the high-acoustic-velocity film 3, opposite to the low-acoustic-velocity film 4 side of the high-acoustic-velocity film 3, is subjected to mirror finishing. By performing mirror finishing, it is possible to strengthen bonding between the high-acoustic-velocity film and the supporting substrate which will be described later.

Figure 21E:
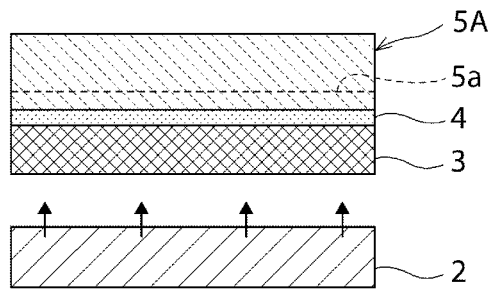

Then, as shown in FIG. 21E, a supporting substrate 2 is bonded to the high-acoustic-velocity film 3.

As the low-acoustic-velocity film 4, as in the first preferred embodiment, a silicon oxide film is used. As the high-acoustic-velocity film 3, an aluminum nitride film is used.

Figure 22A:
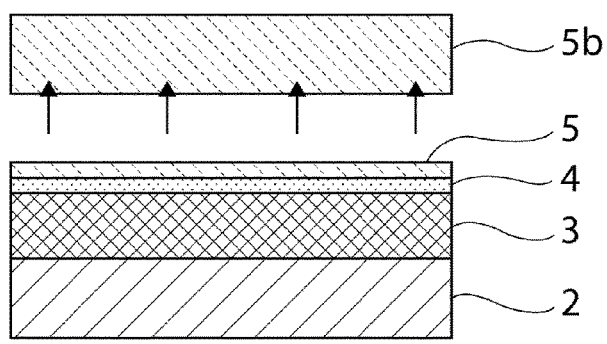
FIGS. 22A to 22C are elevational cross-sectional views for explaining the method for manufacturing a surface acoustic wave device according to the first preferred embodiment of the present invention.

Next, as shown in FIG. 22A, after heating, a piezoelectric substrate portion 5b located above the high concentration ion-implanted region 5a in the piezoelectric substrate 5A is separated. As described above, by applying stress by heating through the high concentration ion-implanted region 5a, the piezoelectric substrate 5A becomes easily separated. In this case, the heating temperature may be set at about 250° C. to 400° C., for example.

Figure 22B:
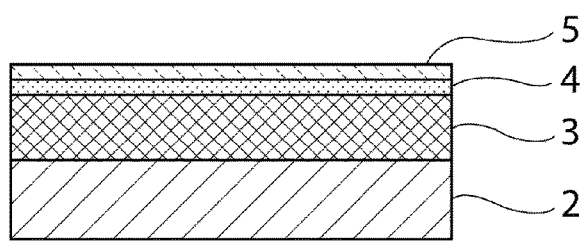

In this preferred embodiment, by the heat-separation, a piezoelectric film 5 with a thickness of about 500 nm, for example, is obtained. In such a manner, as shown in FIG. 22B, a structure in which the piezoelectric film 5 is stacked on the low-acoustic-velocity film 4 is obtained. Then, in order to recover piezoelectricity, heat treatment is performed in which the structure is retained at a temperature of about 400° C. to about 500° C. for about 3 hours, for example. Optionally, prior to the heat treatment, the upper surface of the piezoelectric film 5 after the separation may be subjected to grinding.

Figure 22C:
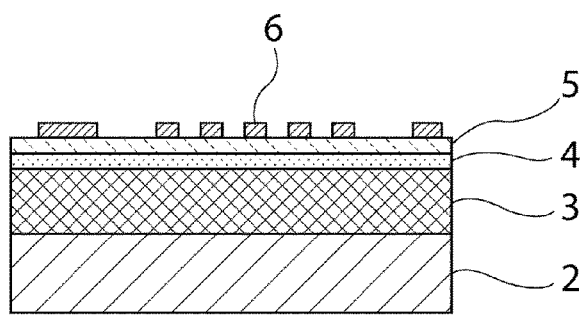

Then, as shown in FIG. 22C, an electrode including an IDT electrode 6 is formed. The electrode formation method is not particularly limited, and an appropriate method, such as vapor deposition, plating, or sputtering, may be used, for example.

According to the manufacturing method of this preferred embodiment, by the separation, it is possible to easily form a piezoelectric film 5 with rotated Euler angles at a uniform thickness.

Eleventh Preferred Embodiment

Figure 27:
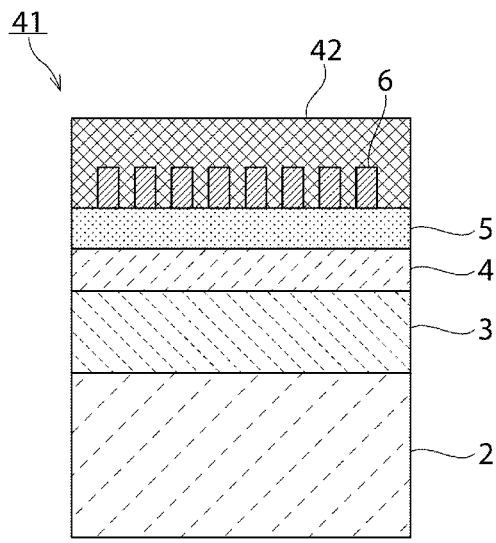
FIG. 27 is a schematic elevational cross-sectional view of a boundary acoustic wave device according to an eleventh preferred embodiment of the present invention.

In the first preferred embodiment, the IDT electrode 6, the piezoelectric film 5, the low-acoustic-velocity film 4, the high-acoustic-velocity film 3, and the supporting substrate 2 are preferably stacked in that order from the top. In a surface acoustic wave device 41 according to an eleventh preferred embodiment shown in FIG. 27, a dielectric film 42 may be arranged so as to cover an IDT electrode 6. By disposing such a dielectric film 42, frequency temperature characteristics can be adjusted, and moisture resistance can be enhanced.

Twelfth Preferred Embodiment

In the preferred embodiments described above, description has been provided for surface acoustic wave devices.

Figure 28:
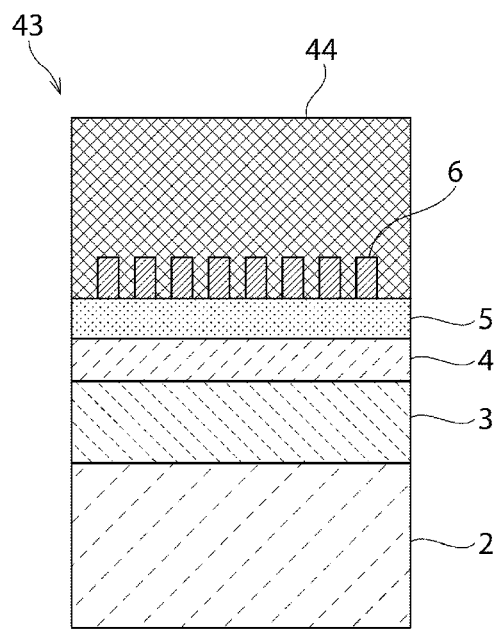
FIG. 28 is a schematic elevational cross-sectional view of a boundary acoustic wave device according to a twelfth preferred embodiment of the present invention.

The present invention can also be applied to other elastic wave devices, such as boundary acoustic wave devices. In such a case, the same advantageous effects can also be obtained. FIG. 28 is a schematic elevational cross-sectional view of a boundary acoustic wave device 43 according to a twelfth preferred embodiment. In this case, a low-acoustic-velocity film 4, a high-acoustic-velocity film 3, and a supporting substrate 2 are preferably stacked in that order from the top, under a piezoelectric film 5. This structure is preferably the same or substantially the same as that of the first preferred embodiment. In order to excite a boundary acoustic wave, an IDT electrode 6 is provided at the interface between the piezoelectric film 5 and a dielectric 44 disposed on the piezoelectric film 5.

Figure 29:
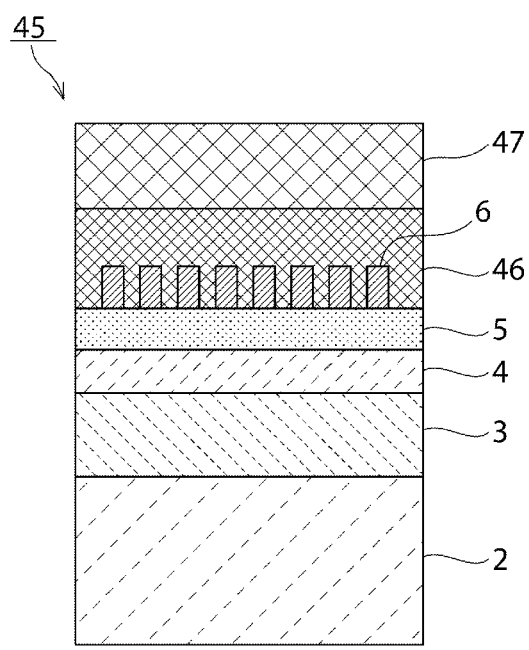
FIG. 29 is a schematic elevational cross-sectional view of a boundary acoustic wave device according to a thirteenth preferred embodiment of the present invention.

Furthermore, FIG. 29 is a schematic elevational cross-sectional view of a boundary acoustic wave device 45 having a three-medium structure. In this case, with respect to a structure in which a low-acoustic-velocity film 4, a high-acoustic-velocity film 3, and a supporting substrate 2 are stacked in that order, under a piezoelectric film 5, an IDT electrode 6 is provided at the interface between the piezoelectric film 5 and a dielectric film 46. Furthermore, a dielectric 47 in which the acoustic velocity of a transversal wave propagating therein is faster than that of the dielectric 46 is disposed on the dielectric 46. As a result, a boundary acoustic wave having a three-medium structure is provided.

In the boundary acoustic wave device, such as the boundary acoustic wave device 43 or 45, as in the surface acoustic wave device 1 according to the first preferred embodiment, by disposing a laminated structure composed of low-acoustic-velocity film 4/high-acoustic-velocity film 3 on the lower side of the piezoelectric film 5, the same effect as that in the first preferred embodiment can be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device including a piezoelectric film, the elastic wave device comprising:
    a high-acoustic-velocity supporting substrate in which an acoustic velocity of a bulk wave propagating therein is higher than an acoustic velocity of an elastic wave propagating in the piezoelectric film;
    a low-acoustic-velocity film stacked on the high-acoustic-velocity supporting substrate;
    the piezoelectric film stacked on the low-acoustic-velocity film; and
    an IDT electrode disposed on a surface of the piezoelectric film; wherein
    a thickness of the low-acoustic-velocity film stacked on the high-acoustic-velocity supporting substrate and disposed under the piezoelectric film is in a range of about 0.1λ to about 0.5λ, where λ is a wavelength of an elastic wave determined by an electrode period of the IDT electrode;
    the piezoelectric film includes at least one of LiTaO$_3$, LiNbO$_3$, ZnO, AlN, and PZT; and
    the low-acoustic-velocity film includes at least one of silicon oxide, glass, silicon oxynitride, tantalum oxide, and any material obtained by adding fluorine, carbon, or boron to silicon oxide.

2. The elastic wave device according to claim 1, wherein a thickness of the piezoelectric film is about 1.5λ or less.

3. The elastic wave device according to claim 1, wherein the elastic wave device further includes at least one of an adhesion layer, an underlying film, and a medium layer.

4. The elastic wave device according to claim 3, wherein the medium layer is composed of a metal.

5. The elastic wave device according to claim 1, wherein the thickness of the low-acoustic-velocity film stacked on the high-acoustic-velocity supporting substrate and disposed under the piezoelectric film is in a range of about 0.2λ to about 0.5λ.

6. An elastic wave device including a piezoelectric film, the elastic wave device comprising:
    a supporting substrate;
    a high-acoustic-velocity film disposed on the supporting substrate, in which an acoustic velocity of a bulk wave propagating therein is higher than an acoustic velocity of an elastic wave propagating in the piezoelectric film;
    a low-acoustic-velocity film stacked on the high-acoustic-velocity film;
    the piezoelectric film stacked on the low-acoustic-velocity film; and
    an IDT electrode disposed on a surface of the piezoelectric film; wherein
    a thickness of the low-acoustic-velocity film stacked on the high-acoustic-velocity film and disposed under the piezoelectric film is in a range of about 0.1λ to about 0.5λ, where λ is a wavelength of an elastic wave determined by an electrode period of the IDT electrode;
    the piezoelectric film includes at least one of LiTaO$_3$, LiNbO$_3$, ZnO, AlN, and PZT; and
    the low-acoustic-velocity film includes at least one of silicon oxide, glass, silicon oxynitride, tantalum oxide, and any material obtained by adding fluorine, carbon, or boron to silicon oxide.

7. The elastic wave device according to claim 6, wherein a thickness of the piezoelectric film is about 1.5λ or less.

8. The elastic wave device according to claim 6, wherein the elastic wave device further includes at least one of an adhesion layer, an underlying film, and a medium layer.

9. The elastic wave device according to claim 8, wherein the medium layer is composed of a metal.

10. The elastic wave device according to claim 6, wherein the thickness of the low-acoustic-velocity film stacked on the high-acoustic-velocity film and disposed under the piezoelectric film is in a range of about 0.2λ to about 0.5λ.

11. The elastic wave device according to claim 1, wherein a material of the high-acoustic-velocity supporting substrate includes at least one of silicon, sapphire, alumina, magnesia, silicon nitride, aluminum nitride, silicon carbide, zirconia, cordierite, mullite, steatite, forsterite, dielectrics, and gallium nitride.

12. An elastic wave device comprising:
    a high-acoustic-velocity supporting substrate;
    a piezoelectric film indirectly stacked on the high-acoustic-velocity supporting substrate;
    an IDT electrode disposed on the piezoelectric film; and
    a low-acoustic-velocity film stacked between the piezoelectric film and the high-acoustic-velocity supporting substrate; wherein
    a material of the piezoelectric film includes at least one of LiTaO$_3$, LiNbO$_3$, ZnO, AlN, and PZT;
    a material of the low-acoustic-velocity film includes at least one of silicon oxide, glass, silicon oxynitride, and tantalum oxide;
    a material of the high-acoustic-velocity supporting substrate includes at least one of silicon, sapphire, alumina, magnesia, silicon nitride, aluminum nitride, silicon carbide, zirconia, cordierite, mullite, steatite, forsterite, dielectrics, and gallium nitride; and a thickness of the low-acoustic-velocity film is in a range of about $0.1\lambda$ to about $0.5\lambda$, where $\lambda$ is a wavelength of an elastic wave determined by an electrode period of the IDT electrode.

13. The elastic wave device according to claim 12, wherein the low-acoustic-velocity film is stacked on the high-acoustic-velocity supporting substrate.

14. The elastic wave device according to claim 12, wherein a thickness of the piezoelectric film is about $1.5\lambda$ or less.

15. The elastic wave device according to claim 12, wherein the elastic wave device further includes at least one of an adhesion layer, an underlying film, and a medium layer.

16. The elastic wave device according to claim 15, wherein the medium layer is composed of a metal.

17. The elastic wave device according to claim 12, wherein the thickness of the low-acoustic-velocity film is in a range of about $0.2\lambda$ to about $0.5\lambda$.

18. An elastic wave device comprising:
a supporting substrate;
a high-acoustic-velocity film directly or indirectly stacked on the supporting substrate;
a piezoelectric film indirectly stacked on the high-acoustic-velocity film;
an IDT electrode disposed on the piezoelectric film; and
a low-acoustic-velocity film stacked between the piezoelectric film and the high-acoustic-velocity film; wherein a material of the piezoelectric film includes at least one of $LiTaO_3$, $LiNbO_3$, ZnO, AlN, and PZT;

a material of the low-acoustic-velocity film includes at least one of silicon oxide, glass, silicon oxynitride, and tantalum oxide;

a material of the high-acoustic-velocity film includes at least one of silicon, sapphire, or alumina, magnesia, silicon nitride, aluminum nitride, silicon carbide, zirconia, cordierite, mullite, steatite, forsterite, dielectrics, and gallium nitride; and a thickness of the low-acoustic-velocity film is in a range of about $0.1\lambda$ to about $0.5\lambda$, where $\lambda$ is a wavelength of an elastic wave determined by an electrode period of the IDT electrode.

19. The elastic wave device according to claim 18, wherein the low-acoustic-velocity film is stacked on the high-acoustic-velocity film.

20. The elastic wave device according to claim 18, wherein a thickness of the piezoelectric film is about $1.5\lambda$ or less.

21. The elastic wave device according to claim 18, wherein the elastic wave device further includes at least one of an adhesion layer, an underlying film, and a medium layer.

22. The elastic wave device according to claim 21, wherein the medium layer is composed of a metal.

23. The elastic wave device according to claim 18, wherein the thickness of the low-acoustic-velocity film is in a range of about $0.2\lambda$ to about $0.5\lambda$.

* * * * *